(12) United States Patent
Nakayama et al.

(10) Patent No.: US 7,609,348 B2
(45) Date of Patent: Oct. 27, 2009

(54) DISPLAY DEVICE WITH BRIDGE SECTION

(75) Inventors: Takanori Nakayama, Mobara (JP);
Ryouhei Suzuki, Mobara (JP); Atsuhiro Katayama, Mobara (JP)

(73) Assignee: Hitachi Displays, Ltd., Chiba (JP)

( * ) Notice: Subject to any disclaimer, the term of this patent is extended or adjusted under 35 U.S.C. 154(b) by 190 days.

(21) Appl. No.: 11/870,693

(22) Filed: Oct. 11, 2007

(65) Prior Publication Data
US 2008/0088784 A1 Apr. 17, 2008

(30) Foreign Application Priority Data
Oct. 12, 2006 (JP) ............... 2006-278651

(51) Int. Cl.
*G02F 1/1335* (2006.01)
(52) U.S. Cl. ..................... 349/137; 349/152
(58) Field of Classification Search ............... None
See application file for complete search history.

(56) References Cited
U.S. PATENT DOCUMENTS
5,798,812 A 8/1998 Nishiki et al.
6,353,464 B1 * 3/2002 Noumi et al. ............. 349/42

FOREIGN PATENT DOCUMENTS
JP 09-090397 4/1997
JP 10-153770 6/1998
JP 11-024101 1/1999

* cited by examiner

*Primary Examiner*—Richard H Kim
(74) *Attorney, Agent, or Firm*—Antonelli, Terry, Stout & Kraus, LLP.

(57) ABSTRACT

Measures are taken against the problem that a conductive matter is attached to an organic film in the vicinity of terminal sections of a display device, which causes electrical connection between the terminals when the terminals are connected to a flexible wiring board. An organic passivation film is formed to the vicinity of the end of the substrate, and a conductive matter is attached to the edge of the organic passivation film. The conductive attachment is divided by extending a bridge section of the organic passivation film to the end of the substrate. Thus, even if a flexible wiring board is connected thereto, the electrical connection between the terminals can be prevented.

15 Claims, 22 Drawing Sheets

A-A

B-B

A-A

A-A

TFT | CAP | PIX

A-A

DISPLAY DEVICE WITH BRIDGE SECTION

The present application claims priority from Japanese application JP2006-278651 filed on Oct. 12, 2006, the content of which is hereby incorporated by reference into this application.

BACKGROUND OF THE INVENTION

1. Technical Field

The present invention relates to a display device, and in particular to a structure of a terminal section of a display panel to which power and signals are supplied from the outside.

2. Related Art

In liquid crystal display devices, organic EL display devices, and so on, there are formed terminal sections for supplying power, image signals, and so on from the outside. The terminal sections are connected to power supplies, signal sources, or drive circuits via, for example, flexible wiring boards. The terminal sections are exposed to the ambient air, and accordingly, reliability is an important factor therefor. Since ordinary metals are eroded by oxygen, moisture, and so on in the atmosphere, chemically stable metal oxide conductive films are used for the terminal sections, and among others, indium tin oxide (ITO) is used frequently.

When the terminals are formed from ITO, etching process is used therefor. Specifically, an ITO film is formed on the entire surface of a substrate by a sputtering process or the like, and then the ITO film is left only on pixel sections and the terminal sections.

The problem described in JP-A-11-24101 (hereinafter referred to as patent document 1) is that the ITO film remains unetched on a lower part of a step formed of a thick organic protective film formed down to the vicinity of each of the terminal sections, which causes electrical connection between the terminals. In patent document 1, measures are taken against the problem so that the residual ITO in the etching process is not caused by making the inclination of the steps gentler between the terminals.

The problem described in JP-A-9-90397 (hereinafter referred to as patent document 2) and JP-A-10-153770 (hereinafter referred to as patent document 3) is caused by the difference in the etching rate of the ITO film between on organic films and on inorganic films. Specifically, in the case in which the ITO film is used commonly for the pixel electrodes and the terminal sections, the ITO is deposited on an organic film in the pixel sections while in the terminal sections the ITO is deposited on an inorganic film. Since the etching rate of the ITO film on an organic film is higher, the ITO film between the terminal sections is not completely etched and remains accordingly. The problem described in patent document 2 and so on is a kind of a problem that the electrical connection between the terminal sections is caused by such a phenomenon. In patent document 2 and so on, the organic film is also formed between the ITO terminals so that the etching rate of the ITO deposited between the terminal sections becomes equal to that in the pixel sections, thereby preventing the electrical connection between the terminal sections.

SUMMARY OF THE INVENTION

The problems described in patent documents 1 through 3 can be solved by forming the terminal sections to have a structure as shown in FIGS. 25 and 26. FIG. 25 is an enlarged plan view of a part of a terminal section 5. FIG. 26 is a cross-sectional view along the B-B line shown in FIG. 25. In FIG. 25, drain wires 261 extending from an effective display section are protected by an organic passivation film (an organic insulating film) 28. The terminal sections 5 of the drain wires 261 are each provided with a through hole 51 of the organic passivation film 28, and a terminal section ITO 52 formed over the through hole 51. Since the uppermost part thereof is covered with the chemically stable ITO 52, reliability of the terminal sections can be assured.

In FIG. 26, the drain wires 261 are formed on an insulating film formed on a TFT substrate 2 made of glass. Between the TFT substrate 2 and the drain wires 261, there are formed a first priming film 20, a second priming film 21, a gate insulating film 23, an interlayer insulating film 25, and so on. Under the organic passivation film 28, there is formed an inorganic passivation film (an inorganic insulating film) 27, which is provided with the through holes 51 having the same shapes as those of the organic passivation film 28.

As shown in FIGS. 25 and 26, since each of the terminal sections is isolated from each other by the organic passivation film 28, the problem of the electrical connection by a conductive attachment 70 caused in the TFT substrate alone by incomplete etching between the terminal sections can be avoided. FIG. 27 is a cross-sectional view along the A-A line shown in FIG. 25. As shown in FIGS. 25 and 27, the organic passivation film 28 is formed down to the vicinity of the end of the substrate 2. The organic passivation film 28 is as thick as about 3 µm. The conductive attachment 70 is apt to be attached around the step thus formed.

The conductive attachment 70 is formed of a chip of a conductive matter such as ITO caused by a rubbing process in the liquid crystal display device manufacturing process, or of a residual of the ITO film in the etching process. Even if such a conductive attachment 70 remains in the vicinity of the end of the substrate, the problem of causing electrical connection between the terminal sections does not arise because the terminal sections are isolated from each other by the organic passivation 28.

However, the conductive attachment 70 causes a problem when making a connection with an external circuit. The connection between the terminals provided to the TFT substrate 2 and the external circuit is typically achieved by a flexible wiring board 61. The situation thereof is shown in FIGS. 28 and 29. FIG. 28 is a perspective plan view showing the condition in which the flexible wiring board 61 is connected to the terminal sections 5. In FIG. 28, wiring sections 62 provided to the flexible wiring board 61 cover the respective terminal sections formed on the TFT substrate 2 so as to be connected thereto. The wiring sections 62 provided to the flexible wiring board 61 are partially covered with a protective film 63.

FIG. 29 is a cross-sectional view along the A-A line shown in FIG. 28. In FIG. 29, the terminal section ITO 52 provided to the terminal section 5 and the wiring section 62 of the flexible wiring board 61 are electrically connected to each other via an anisotropic conductive film 60. The anisotropic conductive film 60 gives rise to electrical connection in the cross-sectional direction while not causing electrical connection in the horizontal direction (an inter-terminal direction). In FIG. 29, the anisotropic conductive film 60 also covers the conductive attachment 70 of the TFT substrate 2. Therefore, the wiring sections 62 provided to the flexible wiring board 61 should be electrically connected to each other via the conductive attachment 70 of the TFT substrate. The situation of the electrical connection is illustrated by the two-headed arrow shown in FIG. 28. The present invention is for taking measures against this problem.

The problem as described above can be solved by the following measures. Although the organic insulating film is formed to have an end thereof receding inside from the end of the substrate, a bridge of the organic insulating film extending from the end of the organic insulating film to the end of the substrate is formed in a part of an area between the terminals adjacent to each other. The bridge prevents the phenomenon that the conductive matter attached to the end of the organic insulating film electrically connects the terminals adjacent to each other when the flexible wiring board is connected thereto. Specific measures are as follows.

(1) A display device including a substrate having an image forming section in which a plurality of pixel sections is arranged in a matrix, each of the pixel sections including a thin film transistor and a pixel electrode, a plurality of terminal sections formed in a periphery of the substrate and for supplying the pixel electrode with a signal, an organic insulating film having a through hole formed in the terminal section, and a metal oxide conductive film formed so as to cover the through hole and a periphery of the through hole, wherein an end of the organic insulating film is located on the substrate outer than the terminal sections, and inner than an end of the substrate, a part of the organic insulating film forms a bridge section extending outside the end of the organic insulating film to the end of the substrate, and the bridge section is located between the terminal sections adjacent to each other.

(2) The display device according to (1), wherein an width of the bridge section is larger than a thickness of the organic insulating film and smaller than a half of a distance between the terminal sections adjacent to each other.

(3) The display device according to (1), wherein a plurality of the bridge sections is located between the terminal sections adjacent to each other.

(4) The display device according to (1), wherein the bridge section has a portion with a larger width and a portion with a smaller width.

(5) The display device according to (4), wherein the larger width is smaller than a half of a distance between the terminal sections adjacent to each other, and the smaller width is larger than a thickness of the organic insulating film.

(6) The display device according to (1), wherein the bridge section and the through hole provided to the terminal section of the organic insulating film are formed in the same process.

(7) The display device according to (1), wherein the metal oxide conductive film is made of ITO.

(8) A liquid crystal display device including a substrate having an image forming section in which a plurality of pixel sections is arranged in a matrix, each of the pixel sections including a thin film transistor and a pixel electrode, and an organic insulating film formed in an upper layer of the thin film transistor, wherein the pixel electrode is formed on the organic insulating film, a wire formed in the same process as a drain wire connected to the thin film transistor extends to a terminal section, the organic insulating film is formed to the outside of the image forming section, a through hole is provided to the organic insulating film in the terminal section, a metal oxide conductive film covers the through hole and a periphery of the through hole, the wire formed in the same process as the drain wire and the metal oxide conductive film are connected to each other at the through hole, an end of the organic insulating film is located on the substrate outer than the terminal sections, and inner than an end of the substrate, a part of the organic insulating film forms a bridge section extending outside the end of the organic insulating film to the end of the substrate, and the bridge section is located between the terminal sections adjacent to each other.

(9) The liquid crystal display device according to (8), wherein the pixel electrode and the metal oxide conductive film provided to the terminal sections are made of the same material, and are formed in the same process.

(10) The liquid crystal display device according to (8), wherein the metal oxide conductive film is made of ITO.

(11) The liquid crystal display device according to (8), wherein the wire extending to the terminal section and formed in the same process as the drain wire is the drain wire.

(12) A liquid crystal display device including a substrate having an image forming section in which a plurality of pixel sections is arranged in a matrix, each of the pixel sections including a thin film transistor and a pixel electrode, and an organic insulating film formed in an upper layer of the thin film transistor, wherein the pixel electrode is formed on the organic insulating film, a wire formed in the same process as a gate wire connected to the thin film transistor extends to a terminal section, the organic insulating film is formed to the outside of the image forming section, a through hole is provided to the organic insulating film in the terminal section, a metal oxide conductive film covers the through hole and a periphery of the through hole, the wire formed in the same process as the gate wire and the metal oxide conductive film are connected to each other at the through hole, an end of the organic insulating film is located on the substrate outer than the terminal sections, and inner than an end of the substrate, a part of the organic insulating film forms a bridge section extending outside the end of the organic insulating film to the end of the substrate, and the bridge section is located between the terminal sections adjacent to each other.

(13) The liquid crystal display device according to (12), wherein the wire formed in the same process as the gate wire is the gate wire.

(14) An organic EL display device including a substrate having an image forming section in which a plurality of pixel sections is arranged in a matrix, each of the pixel sections including a thin film transistor and an organic EL light emitting section, and an organic insulating film formed in an upper layer of the thin film transistor, wherein the organic EL light emitting section includes a lower electrode formed of an oxide conductive film, an organic EL layer and an upper electrode formed of a metal layer, and is formed on the organic insulating film, a plurality of terminal sections is formed in a periphery of the image forming section, the organic insulating film is formed to the outside of the image forming section, a through hole is provided to the organic insulating film in the terminal section, a metal oxide conductive film covers the through hole and a periphery of the through hole, an end of the organic insulating film is located on the substrate outer than the terminal sections, and inner than an end of the substrate, a part of the organic insulating film forms a bridge section extending outside the end of the organic insulating film to the end of the substrate, and the bridge section is located between the terminal sections adjacent to each other.

(15) An organic EL display device including a substrate having an image forming section in which a plurality of pixel sections is arranged in a matrix, each of the pixel sections including a thin film transistor and an organic EL light emitting section, and an organic insulating film formed in an upper layer of the thin film transistor, wherein the organic EL light emitting section includes a lower electrode formed of a metal layer, an organic EL layer and an upper electrode formed of an oxide conductive film, and is formed on the organic insulating film, a plurality of terminal sections is formed in a periphery of the image forming section, the organic insulating film is formed to the outside of the image forming section, a through hole is provided to the organic insulating film in the terminal section, a metal oxide conductive film covers the through hole and a periphery of the through hole, an end of the organic insulating film is located on the substrate outer than the terminal sections, and inner than an end of the substrate, a part of the organic insulating film forms a bridge section extending outside the end of the organic insulating film to the end of the substrate, and the bridge section is located between the terminal sections adjacent to each other.

The advantages of the present invention corresponding to each of the measures will be described as follows.

According to the measure (1), although the end of the organic insulating film of the display device is formed inner than the end of the substrate, by forming the bridge section of the organic insulating film extending from the end of the organic insulating film to the end of the substrate in a part between the terminal sections adjacent to each other, and the bridge section prevents the electrically connection between the terminals caused when connecting the flexible wiring board to the display device.

According to the measure (2), in addition to the advantage of the measure (1), since the width of the bridge section is set larger than the thickness of the organic insulating film, and smaller than a half of the distance between the terminal sections, the peeling of the bridge section can be prevented when cutting the substrate.

According to the measure (3), in addition to the advantage of the measure (1), since a plurality of the bridge sections is formed between the terminal sections, even if the alignment between the substrate and the flexible wiring board is shifted, the electrical connection between the terminals can be cut by either bridge section.

According to the measure (4), in addition to the advantage of the measure (1), since the bridge section has a portion with lager width and a portion with a smaller width, the adhesive force of the bridge section with the lower films can be increased, and the peeling force when cutting the substrate can be reduced.

According to the measure (5), in addition to the advantage of the measure (1), since the portion with the larger width is set to be smaller than a half of the distance between the terminal sections and the portion with the smaller width is set to be larger than the film thickness of the organic insulating film, the peeling of the bridge section can be prevented.

According to the measure (6), in addition to the advantage of the measure (1), since the bridge section of the organic insulating film and the through hole of the terminal section are formed in the same process, an additional cost for forming the bridge section can be eliminated.

According to the measure (7), in addition to the advantage of the measure (1), since the ITO, which is widely used, is used as the metal oxide conductive film, the reliability can be assured, and the cost reduction becomes possible.

According to the measures (8) through (11), by applying the present invention to the liquid crystal display device, a highly reliable liquid crystal display device can be realized. Further, the organic insulating film and the metal oxide conductive film are formed in the pixel sections and the terminal sections using the common materials and the common process, increase in cost can be prevented. Still further, since the same wire as the drain wire having a low resistance is extended to the terminal section, the wiring resistance from the terminal sections to the effective screen can be reduced.

According to the measures (12) and (13), since the gate wire, for which a material with low resistance and chemically stable in comparison with the drain wire is sometimes used, is extended to the terminal section, the wiring resistance from the terminal sections to the effective screen can be reduced.

According to the measure (14), by applying the present invention to the bottom emission type organic EL display device, a highly reliable bottom emission type organic EL display device can be realized.

According to the measure (15), by applying the present invention to the top emission type organic EL display device, a highly reliable top emission type organic EL display device can be realized.

DESCRIPTION OF THE PREFERRED EMBODIMENTS

The present invention will be disclosed in detail with reference to the following embodiments.

First Embodiment

Figure 1:
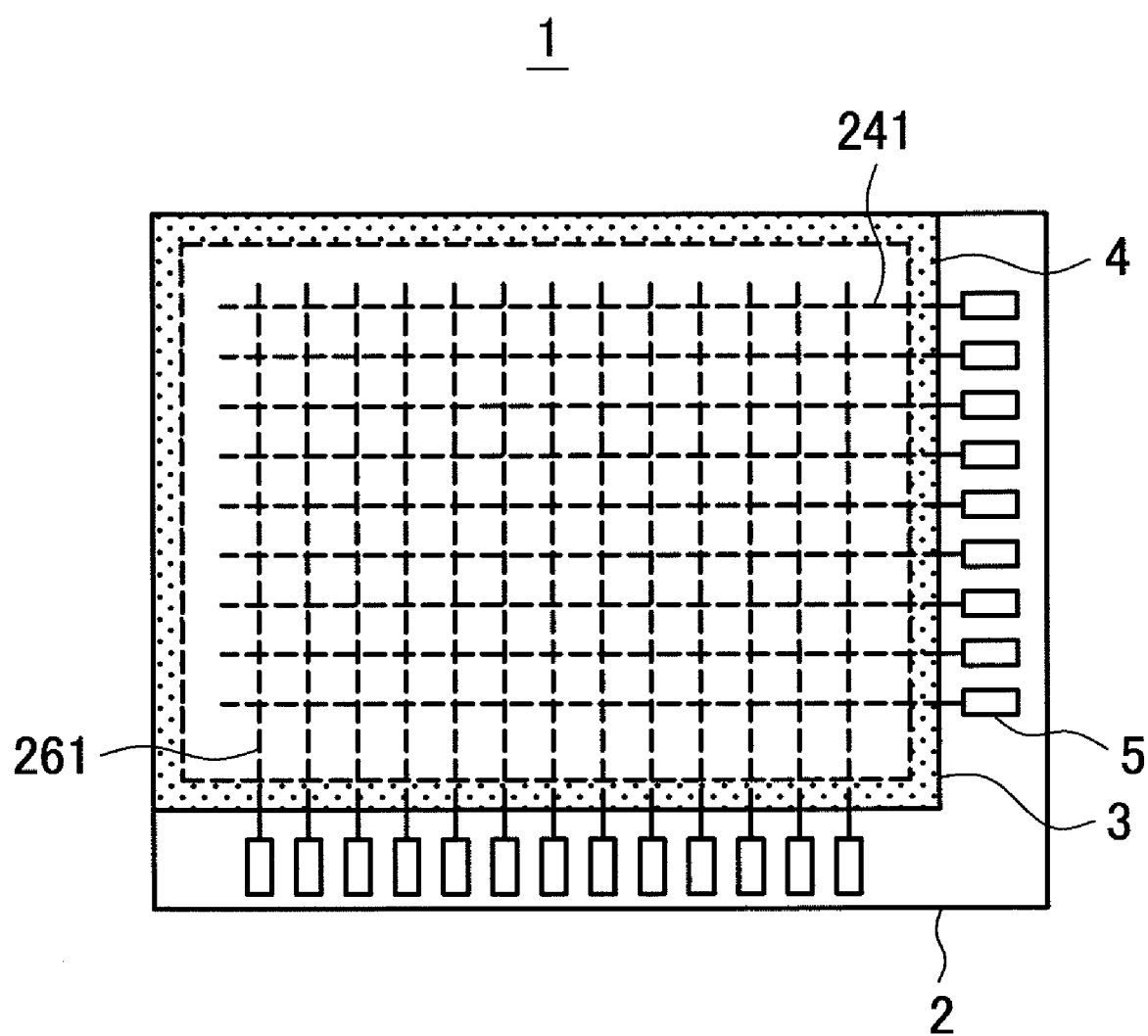
FIG. 1 is a schematic plan view of a liquid crystal display device.

FIG. 1 is a schematic plan view of a liquid crystal display device 1 to which the present invention is applied. In FIG. 1, a TFT substrate 2 is provided with drain wires 261 for supplying image signals and gate wires 241 for supplying scan signals formed so as to intersect each other. In the vicinity of each of the intersections between the drain wires 261 and the gate wires 241, there are formed a pixel and a thin film transistor (TFT) as a switching element. Further, in the periphery of the TFT substrate 2, there are formed terminal sections 5 for supplying the liquid crystal display device 1 with signals, power, and so on. On the TFT substrate 2, there is disposed a color filter 3 via a seal section 4.

Figure 2:
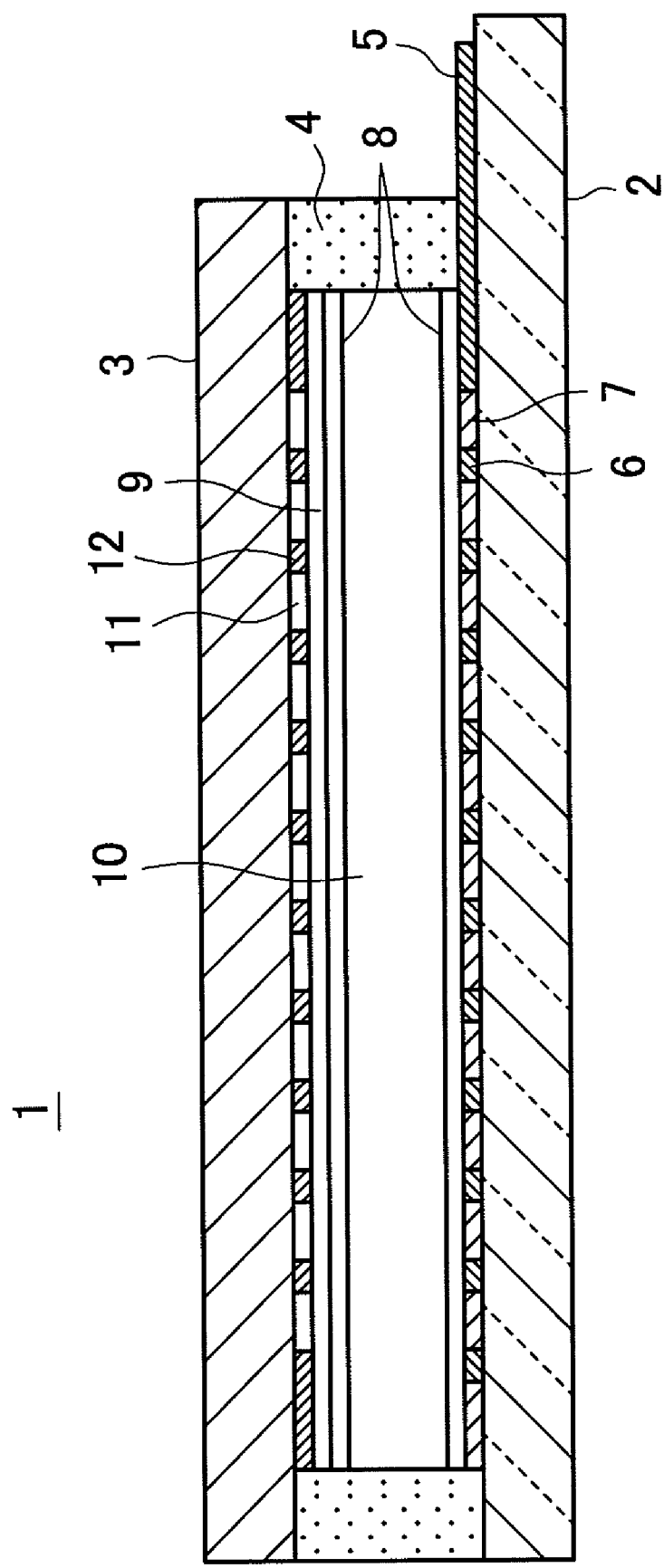
FIG. 2 is a schematic cross-sectional view of the liquid crystal display device.

FIG. 2 is a schematic cross-sectional view of the liquid crystal display device 1. In FIG. 2, pixel electrodes 7 are connected to the respective terminal sections 5 by the drain wires or the gate wires via respective TFT sections 6. On the pixel electrodes 7, there is formed an orientation film 8 for orienting liquid crystal 10. Further, the color filter substrate 3 is disposed with a predetermined distance from the TFT substrate 2 via the seal section 4. The liquid crystal 10 is encapsulated by the TFT substrate 2, the color filter substrate 3, and the seal section 4. The color filter substrate 3 is provided with a color filter 11, a black matrix 12, an opposed electrode 9 formed of a transparent electrode, and the orientation film 8 formed thereon.

The orientation film 8 is for orienting the liquid crystal 10 in a specific direction, the specific direction being formed by a rubbing process. Since in the rubbing process, the surface of the orientation film is rubbed with a fibrous matter, static and chips are easily generated. The chips and so on caused by the rubbing process constitute one of the factors of the conductive attachment 70 shown in FIG. 25 and so on. In addition, in the liquid crystal manufacturing process, conductive residuals are caused by etching processes of various conductive matters such as metal, which can also constitute a factor of the conductive attachment 70 shown in FIG. 25 and so on.

Figure 3:
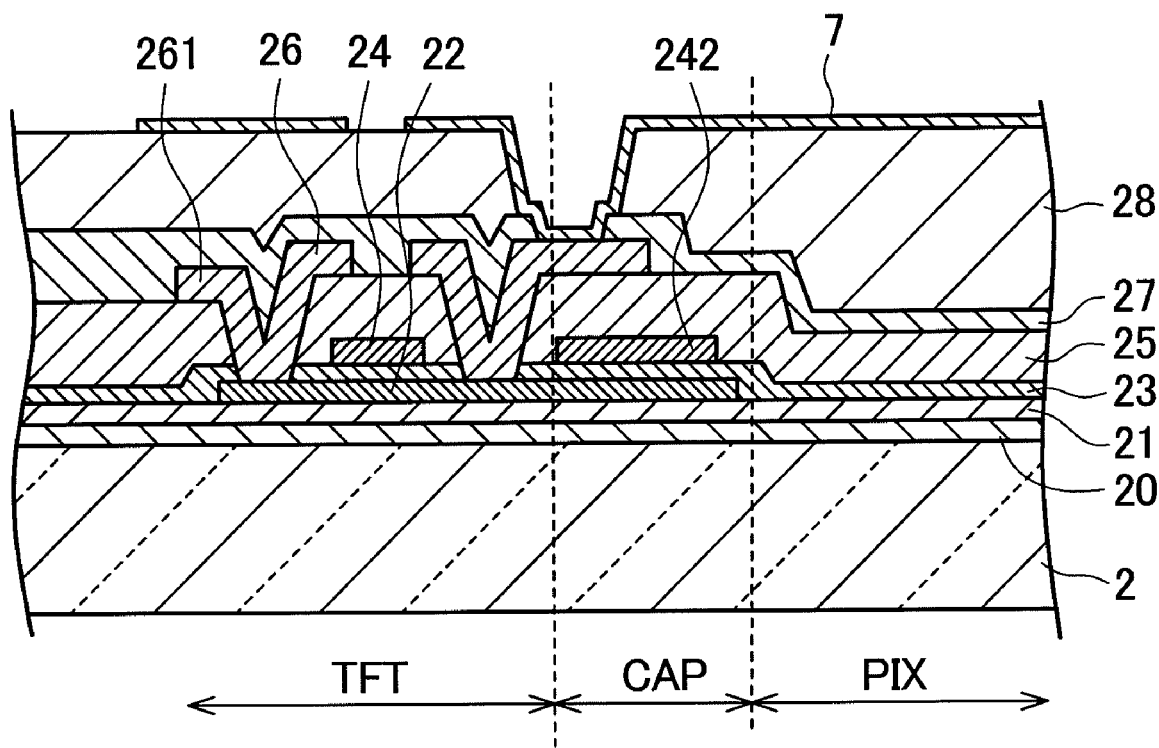
FIG. 3 is a cross-sectional view of a top-gate TFT.

FIG. 3 shows a cross-sectional structure of the pixel section. FIG. 3 shows a cross-sectional structure of a so-called top-gate TFT. In the TFT substrate 2, the pixel sections and the terminal sections are formed in the same process. In FIG. 3, first priming film 20 made of SiN and second priming film 21 made of $SiO_2$ are applied on the TFT substrate 2 made of glass. These priming films have a role of preventing impurities from the glass substrate from contaminating a semiconductor film 22.

On the second priming film 21, there is formed the semiconductor film 22. The semiconductor film 22 in this case is made of polysilicon. The gate insulating film 23 made of $SiO_2$ using tetraethoxisilane (TEOS) is formed so as to cover the semiconductor film 22. On the gate insulating film 23, there are formed a gate electrode 24, the gate wire 241, and a holding capacitance wire 242. After forming the gate electrode 24, impurities are implanted by ion implantation to provide the semiconductor film 22 with electrical conductivity. Since the ion implantation is performed using the gate electrode 24 as a mask, the impurity ions are not implanted under the gate electrode 24, and accordingly, the channel section of the TFT is formed under the gate electrode 24. In the semiconductor film 22, the portion in which the impurity ions are implanted becomes the source section or the drain section (S/D section) of the TFT.

An interlayer insulating film 25 made of $SiO_2$ is formed so as to cover the gate electrode 24. On the interlayer insulating film 25, there are formed either one of the source electrode and the drain electrode (S/D electrode) 26 and the drain wire 261. The drain section of the semiconductor film 22 and the drain wire are electrically connected to each other via a through hole provided to the gate insulating film 23 and the interlayer insulating film 25. An inorganic passivation film 27 is formed so as to cover the S/D electrode 26, and further, an organic passivation film 28 is formed thereon.

The inorganic passivation film 27 and the organic passivation film 28 both have a role of protecting the TFT. The organic passivation film 28 additionally has a role of planarizing the pixel sections. In order for achieving this object, the organic passivation film 28 is formed to have a large thickness of, for example, 3 μm in comparison with other films. As the material of the organic passivation film 28, acrylic resin, siloxane resin, and so on can be used.

On the organic passivation film 28, there is formed an ITO film as the pixel electrode 7. Although in the present embodiment, ITO is used for the pixel electrode 7, metal oxide conductive film such as an AZO film or an IZO film can be used therefor besides the ITO film. Also in the following examples, ITO is described as an example of the metal oxide conductive film. It should be noted that the ITO used for the pixel electrode 7 is the same as the ITO used for the terminal sections 5, and is formed in the same process. The pixel electrode 7 and the S/D electrode 26 are electrically connected via a through hole provided to the inorganic passivation film 27 and the organic passivation film 28.

In FIG. 3, in the vicinity of the TFT 6, there is formed a holding capacitance to be connected thereto in parallel to a pixel capacitance. The holding capacitance is formed of the holding capacitance wire 242 and the polysilicon semiconductor film 22 electrically connected to the S/D section of the semiconductor film having the gate insulating film 23 therebetween. As described above, the pixel sections provided to the TFT substrate 2 are each composed of the TFT section, the holding capacitance section CAP, and the pixel electrode section PIX.

Figure 4:
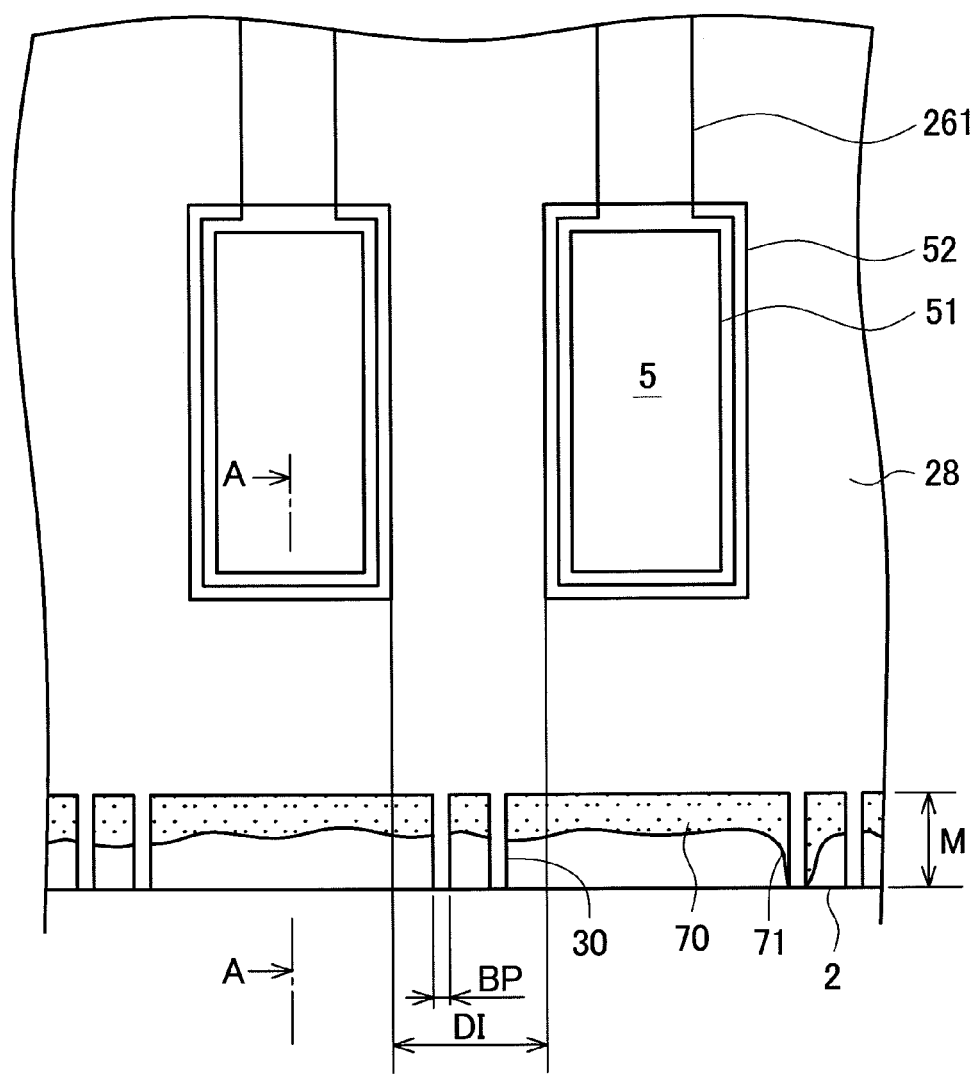
FIG. 4 is a plan view of a first embodiment.

FIG. 4 is a perspective view of the vicinity of the terminal sections 5 showing an embodiment of the present invention. The structure of the terminal section 5 is as explained with reference to FIGS. 25 and 26. The films in the terminal sections 5 are formed at the same time when the TFT explained above is formed. In FIG. 4, the periphery of each of the terminal sections 5 is covered by the organic passivation film 28. The present embodiment is characterized in that bridge sections 30 of the organic passivation film 28 and the inorganic passivation film 27 is formed between the end of the organic passivation film 28 and the end of the TFT substrate 2. The conductive attachment 70 is divided by the bridge sections 30. As shown in FIG. 4, the bridge sections 30 is effectively formed between the terminal sections 5 adjacent to each other.

Figure 5:
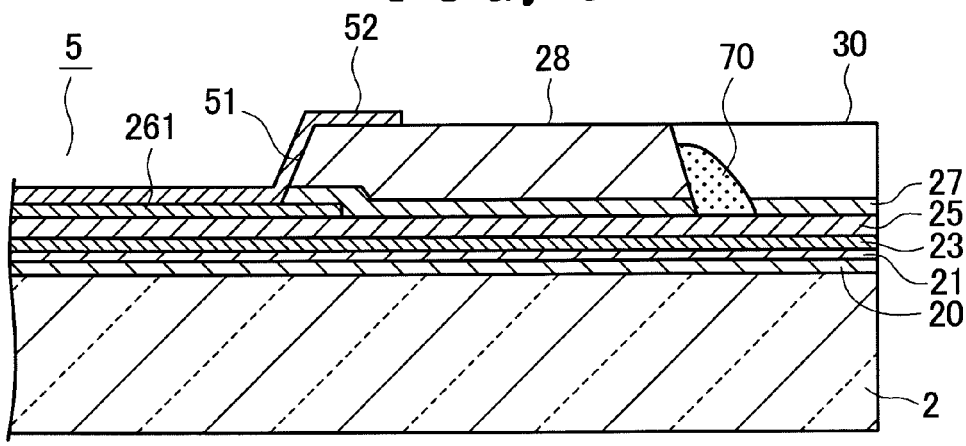
FIG. 5 is a cross-sectional view of the first embodiment.

FIG. 5 is a cross-sectional view along the A-A line shown in FIG. 4. FIG. 5 shows a situation in which the conductive attachment 70 attached to the edge of the organic passivation film 28 is divided by a wall formed of the bridge section 30. The bridge sections 30 are formed at the same time when the organic passivation film 28 is developed or formed by etching. Therefore, the level of the wall shown in FIG. 5 is the same as the level of the organic passivation film 28. It should be noted that although the conductive attachment 70 is attached along the bridge section 30 in some cases as denoted with the reference numeral 71 in FIG. 4, there is no difference in that the conductive attachment 70 is separated by the bridge from the conductive attachment 70 on the other side thereof. In FIG. 5, the drain wire 261 extends to the terminal section 5 as a wire. However, the wire is not necessarily connected to the drain wire 261, and it simply shows that the wire and the drain wire 261 are formed in the same process. For example, instead of drawing the gate wire 241 to the terminal, a wire, which is electrically connected to the gate wire 241 via a through hole provided to the interlayer insulating film 25 and is formed in the process of forming the drain wire, can be drawn to the terminal section 5.

Figure 6:
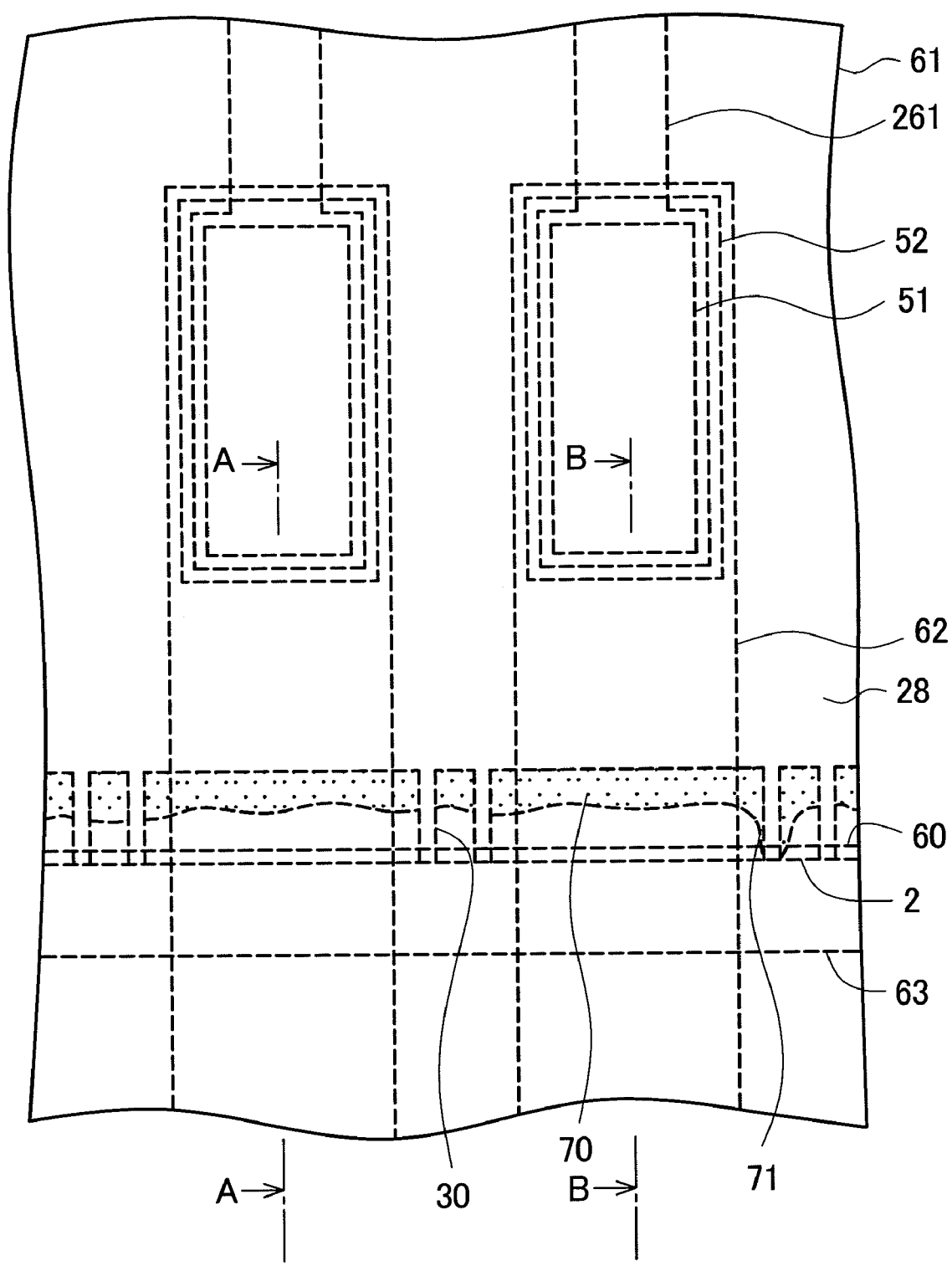
FIG. 6 is a perspective view showing the first embodiment provided with a flexible wiring board.
Figure 7:
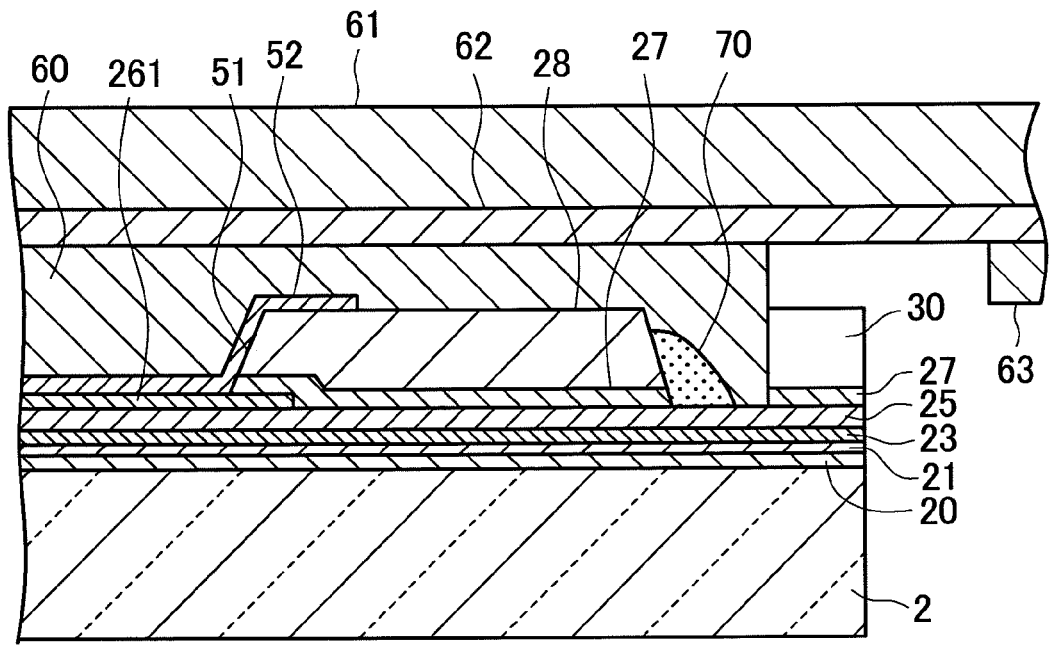
FIG. 7 is a cross-sectional view showing the first embodiment provided with the flexible wiring board.

FIG. 6 is a perspective view showing the condition in which the flexible wiring board 61 is connected to the terminal sections 5 according to the present embodiment. FIG. 7 is a cross-sectional view along the A-A line shown in FIG. 6. In FIG. 7, the flexible wiring board 61 and the terminal sections 5 provided to the TFT substrate 2 are connected to each other via the anisotropic conductive film 60. Although the anisotropic conductive film 60 and each of the conductive attachments 70 are electrically connected to each other, the conductive attachments 70 are separated by the bridge sections 30 extending from the organic passivation film 28, and accordingly, the wires of the flexible wiring board 61 are never electrically connected to each other.

Figure 8:
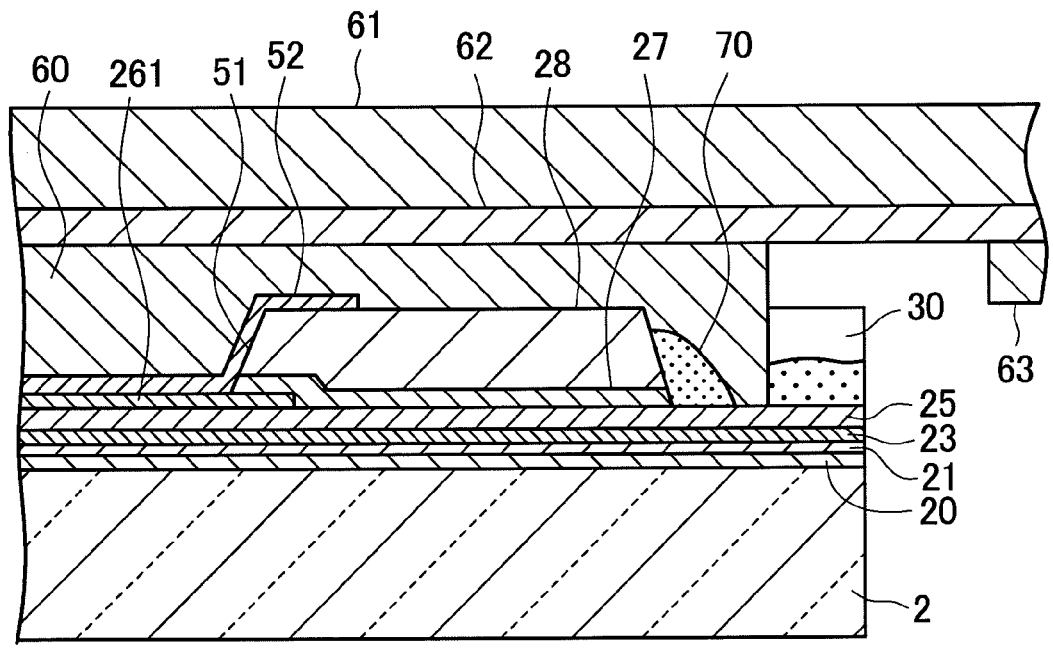
FIG. 8 is another cross-sectional view showing the first embodiment provided with the flexible wiring board.

FIG. 8 is a cross-sectional view along the B-B line shown in FIG. 6. In FIG. 6, the reference numeral 71 shows an example of the case in which the conductive attachment 70 is attached down to the end of the bridge section 30. Even in such a case, as shown in FIG. 8, since the conductive attachments 70 are separated by the wall of the bridge section 30, the wires of the flexible wiring board 61 are never electrically connected to each other.

In the present embodiment, as shown in FIG. 4, two bridge sections 30 are formed between a pair of terminals. An operation for aligning the wiring section 62 of the flexible wiring board 61 and the terminal sections 5 of the TFT substrate 2 with each other is required. Depending on a variation in the operation, there might be some cases in which the wiring sections 62 of the flexible wiring board 61 and the terminal sections 5 are shifted from each other. In such a case, if there is a case in which the wiring sections 62 of the flexible wiring board 61 is shifted exceeding the bridge section 30 provided to the TFT substrate 2, the advantage of the present invention can hardly be achieved. In contrast, in the case in which the two bridge sections 30 are provided, even if the displacement between the flexible wiring board 61 and the terminal 5 provided to the TFT substrate 2 occurs so as to exceed one of the bridge sections 30, the other of the bridge sections 30 can prevent the electrical connection between the wires, thus the advantage of the present invention can surely be achieved.

Figure 9:
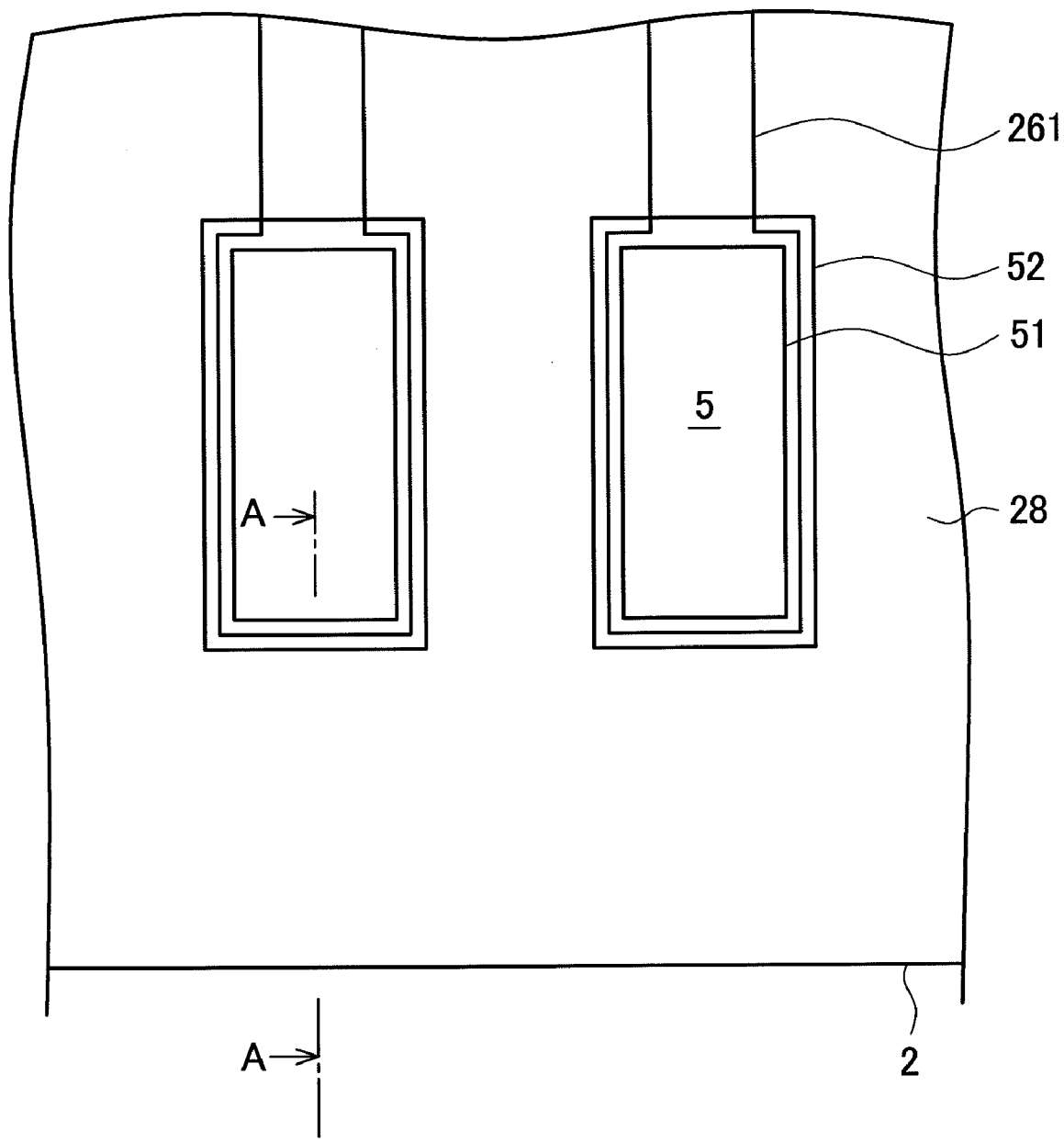
FIG. 9 is a plan view of a comparative example.
Figure 10:
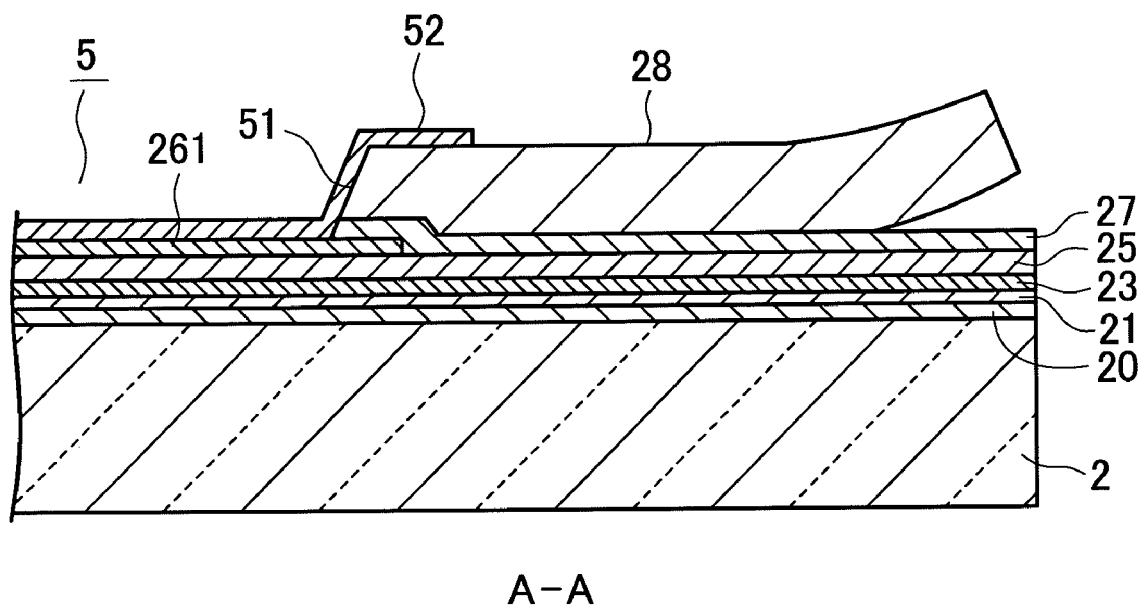
FIG. 10 is a cross-sectional view of the comparative example.

Incidentally, as shown in FIG. 9, if the organic passivation film 28 is formed entirely to the end of the TFT substrate 2, the problem of the conductive attachment 70 attached to the edge of the organic passivation film 28 does not occur. However, if such a configuration is adopted, peeling of the organic passivation film 28 occurs when cutting the TFT substrate 2 as shown in FIG. 10. This is because the organic passivation film 28 is about 3 µm thick, which is vary thick in comparison with the rest of the films. In order for preventing the peeling of the organic passivation film 28, the end of the organic passivation film 28 is formed about 100 µm inner from the end of the TFT substrate 2 (see the reference character M in FIG. 4).

The width BP of each of the bridge sections 30 shown in FIG. 4 needs to be determined in consideration of the relationship between the stress against the peeling of the organic passivation film 28 when cutting the TFT substrate and the adhesive force of the organic passivation film 28. If the width of the bridge section 30 is small, the force of peeling the organic passivation film 28 when cutting the substrate is weak. On the other hand, the larger the width of the bridge section 30 is, the stronger the adhesive force of the organic passivation film 28 with the priming film is. Therefore, the width of the bridge section 30 needs to be determined in consideration of the peeling force when cutting the TFT substrate and the adhesive force of the organic passivation film 28.

In the present embodiment, the width BP of the bridge section 30 is 10 µm. Since the organic passivation film 28 is as thick as about 3 µm, it is very difficult to reduce the width in consideration of the etching accuracy. Taking the etching accuracy and the adhesive force of the organic passivation film 28 into consideration, the minimum value of the width BP is about 3 µm. On the other hand, if the width BP is set to be too large, the peeling force when cutting the substrate becomes strong. However, in the present embodiment, the width BP of the bridge section 30 by itself never exceeds a half of the distance DI between the terminal sections ITO 52 of the two adjacent terminal sections. Providing it is smaller than or equal to a half of the distance DI between the terminal sections ITO 52, the peeling force can substantially be reduced in comparison with the case in which the organic passivation film 28 is a continuous film. Therefore, the upper limit thereof in the present embodiment can be set to a half of the distance DI between the terminal sections ITO 52.

Figure 11:
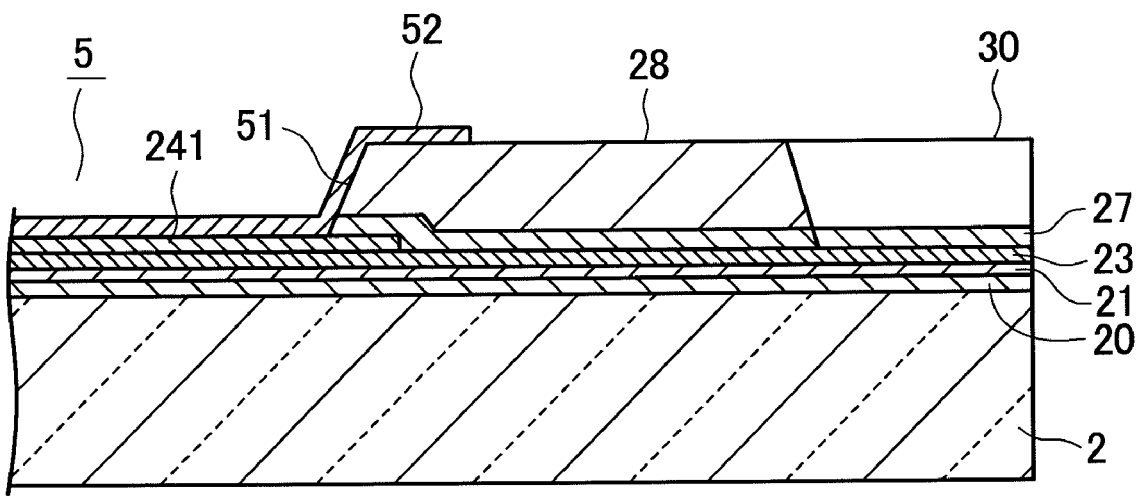
FIG. 11 is a cross-sectional view showing another form of the first embodiment.

In the above explanations, it is assumed that the drain wire 261 extends to the terminal section 5 to be connected to the terminal section ITO 52. However, depending on the design, there are some cases in which the gate wire 241, instead of the drain wire 261, extends to the terminal section 5 to be connected to the terminal section ITO 52. In such cases, the configuration explained hereinabove can directly be applied without modifications. FIG. 11 shows a case in which the gate wire 241 extends to the terminal section 5. In FIG. 11, the terminal section ITO 52 is formed covering the gate wire 241. Since the gate wire 241 is used, the insulating films lower than the organic passivation film 28 or the inorganic passivation film 27 includes three layers, namely the first priming film 20, the second priming film 21, and the gate insulating film 23. Although the insulating films are fewer by one layer in comparison with the configuration shown in FIG. 5 and so on, they are the same in nature. In other words, as shown in FIG. 11, the configuration that the inter-terminal electrical connection caused by the conductive attachment 70 is prevented by extending the bridge section 30 of the inorganic passivation film 27 and the organic passivation film 28 to the end of the TFT substrate is maintained.

In FIG. 11, the gate wire 241 extends to the terminal section 5 as a wire. However, the wire is not necessarily connected to the gate wire, and it simply shows that the wire and the gate wire are formed in the same process. For example, instead of drawing the drain wire to the terminal, a wire, which is electrically connected to the drain wire via a through hole provided to the interlayer insulating film 25 and is formed in the process of forming the gate wire, can be drawn to the terminal section 5.

Second Embodiment

Figure 12:
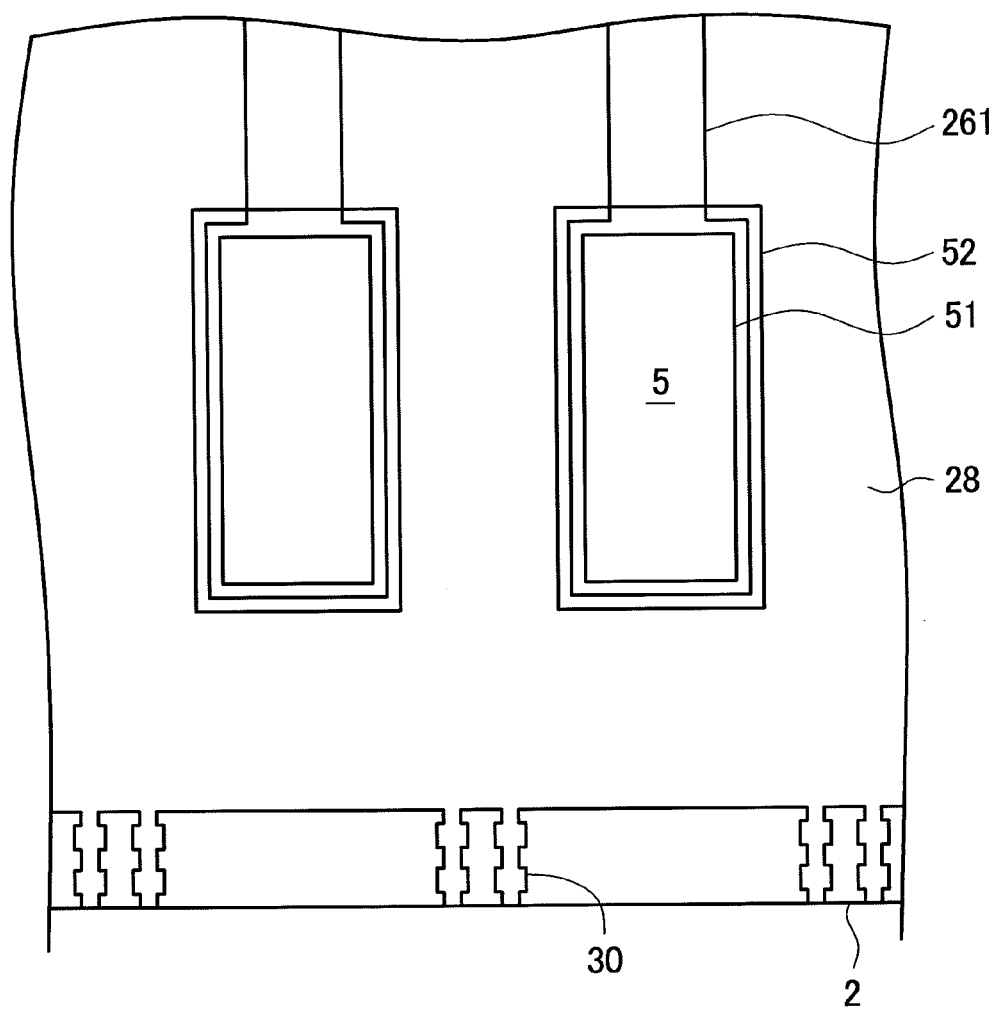
FIG. 12 is a diagram showing a form of a second embodiment.
Figure 13:
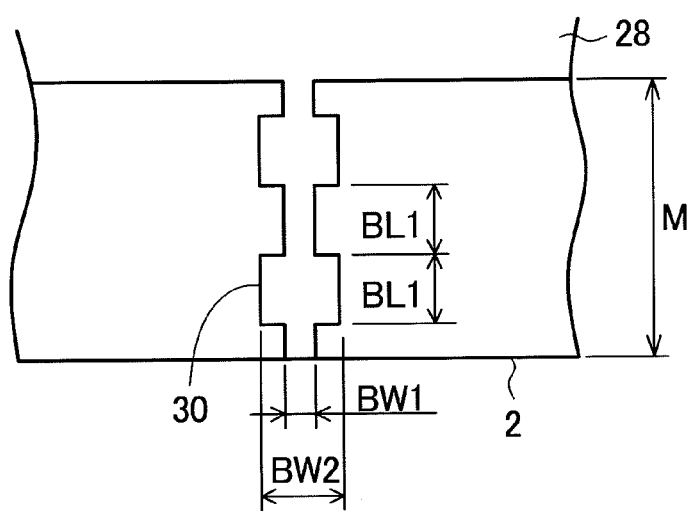
FIG. 13 is a detailed view of a form of the second embodiment.

FIG. 12 shows the second embodiment of the present invention. What is different from the first embodiment is that the shape of the bridge section 30 is modified to have a step in the width thereof instead of the parallel lines. FIG. 13 shows an enlarged view of the bridge section 30 shown in FIG. 12. As shown in FIG. 13, the bridge section 30 is provided with portions with large width and portions with small width formed alternately. The portions with large width have strong adhesive force with the interlayer insulating film and so on formed under the organic passivation film 28. On the other hand, when cutting the TFT substrate 2, the peeling force caused by the cutting process can be reduced with the organic passivation film 28 having a smaller width.

In the present embodiment, the width of the bridge section is set smaller in the cutting section of the TFT substrate 2, and portions with larger width are disposed on positions with predetermined distances from the cutting section. In the TFT substrate cutting section, the width is set smaller to weaken the peeling force caused when cutting the substrate, while in other sections, the width is set larger to assure the adhesive force with the underlying films. In FIG. 13, the distance M from the end of the organic passivation film 28 to the end of the TFT substrate 2 is 100 μm. The width BW1 of the portions with small width of the bridge section is, for example, 10 μm, and the width BW2 of the portions with large width is 25 μm. Further, the length BL1 of each of the portions with small width is, for example, 25 μm, the length BL2 of each of the portions with large width is 25 μm. In other words, the portions with large width of the bridge section have square shapes.

The reason for forming the portions with the small width and the portions with the large width alternately is as follows. There are some cases in which the bridge section 30 formed of the organic passivation film 28 is peeled when cutting the TFT substrate 2. Even if the case in which the bridge section 30 is peeled occurs, by forming the portions with the small width, the bridge section is broken in the portion with the small width and peeled at that portion. Therefore, the portions with the large width remain unpeeled, thus the defect caused by the peeling of the organic passivation film 28 can be prevented from occurring.

Although in FIG. 13 two pairs of the portion with the large width and the portion with the small width are provided, it is obvious that there is no need for limiting it to two pairs. Further, although in FIG. 13, the portion with the small width is provided to the cutting section, as explained above, if the peeling is caused in the bridge section 30, the peeling defect of the organic passivation film 28 can be prevented if the bridge section 30 is broken at the portion with the small width, and accordingly, there is no need for limiting the cutting section to the portion of the bridge section 30 with the small width.

The shapes of the portions of the bridge section 30 with the small width and the portions thereof with the large width can be determined as follows. As explained in the first embodiment, the portion with the small width has a limitation caused by the etching accuracy. Therefore, it needs to be equal to or larger than about 3 μm, which is the film thickness of the organic passivation film 28. On the other hand, the upper limit of the portion of the bridge section 30 with the large width needs to be equal to or smaller than a half of the distance DI between the adjacent terminal sections ITO.

Figure 14:
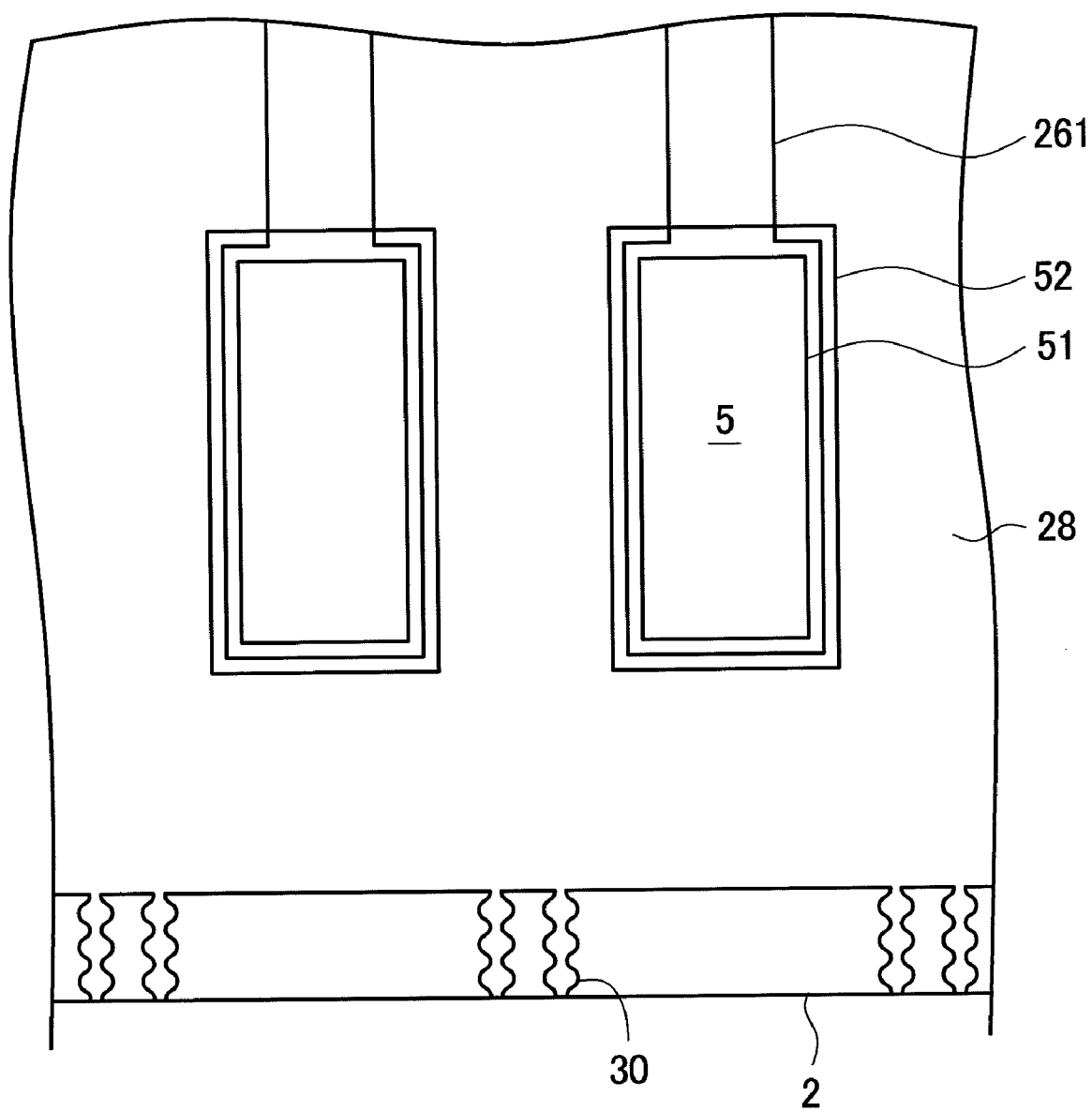
FIG. 14 is a diagram showing another form of the second embodiment.

FIG. 14 shows another example of the shape of the bridge section 30 of the organic passivation film 28. The example shown in FIG. 14 is the same in nature as the example shown in FIG. 12, but is different from the example shown in FIG. 12 in that the steps between the portions with the large width and the portion with the small width of the bridge section 30 are eliminated, and the portions are connected with smooth curves. By thus connecting the portions with the large width and the portion with the small width of the bridge section 30 using the smooth curves, if the cutting line is shifted when cutting the TFT substrate 2, the possibility of directly cutting the portion with the large width of the bridge section 30 can be reduced. Further, when a part of the bridge section formed of the organic passivation film 28 is peeled, breakage in the narrowest portion of the bridge section becomes easy to occur, thus the reliability can be enhanced also in this respect.

In the example shown in FIG. 14, the minimum width of the bridge section 30 is preferably set to about 3 μm, which is the film thickness of the organic passivation film 28 in consideration of the etching accuracy, and the maximum thereof is preferably set to be equal to or smaller than a half of the distance DI between the terminal sections ITO similarly to what is described in the first embodiment.

Figure 15:
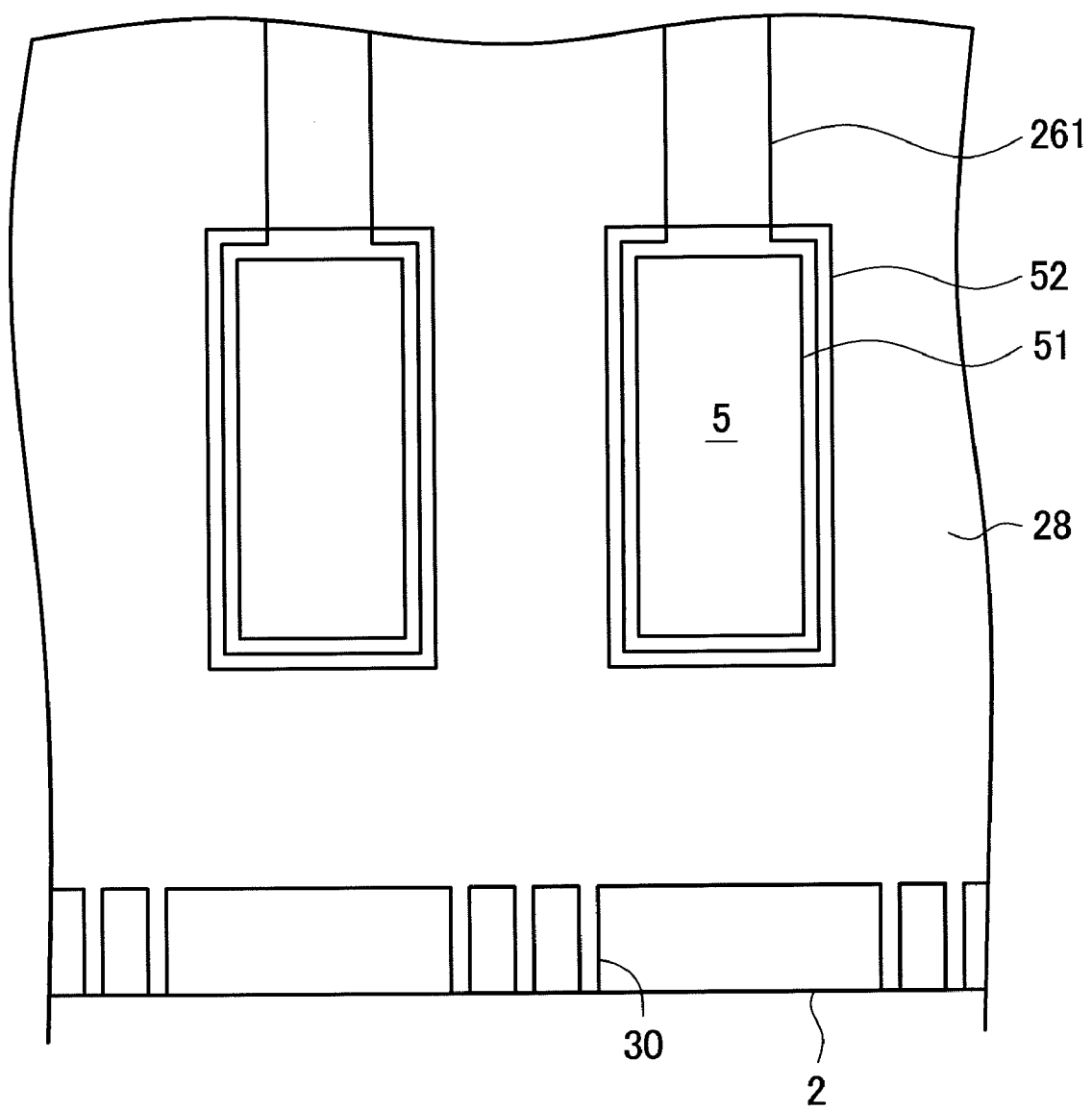
FIG. 15 is a diagram showing still another form of the second embodiment.

FIG. 15 shows an example forming three bridge sections 30 of the organic passivation film 28 between the adjacent terminal sections ITO. In the example shown in FIG. 15, the three bridge sections 30 are formed, and thus, the reliability against the electrical connection caused between the terminals by the conductive attachment 70 can be enhanced accordingly in comparison with the first embodiment. Further, even if the alignment between the terminals of the TFT substrate 2 and the wiring section 62 of the flexible wiring board 61 is shifted beyond two bridge sections 30, the object of the present invention of preventing the electrical connection between the terminals caused by the conductive attachment 70 can be achieved.

In FIG. 15, the minimum width of the bridge section 30 needs to be set to be equal to or larger than 3 μm substantially equal to the thickness of the organic passivation film 28 taking the etching accuracy and the adhesive force between the organic passivation film 28 and the lower insulating films into consideration similarly to the first embodiment and so on. On the other hand, the upper limit thereof is consequently equal to or smaller than a third of the distance DI between the terminal sections ITO. Although in FIG. 15, three bridge sections are formed between the terminal sections ITO, it is obvious that four or more bridge sections can be formed.

Figure 16:
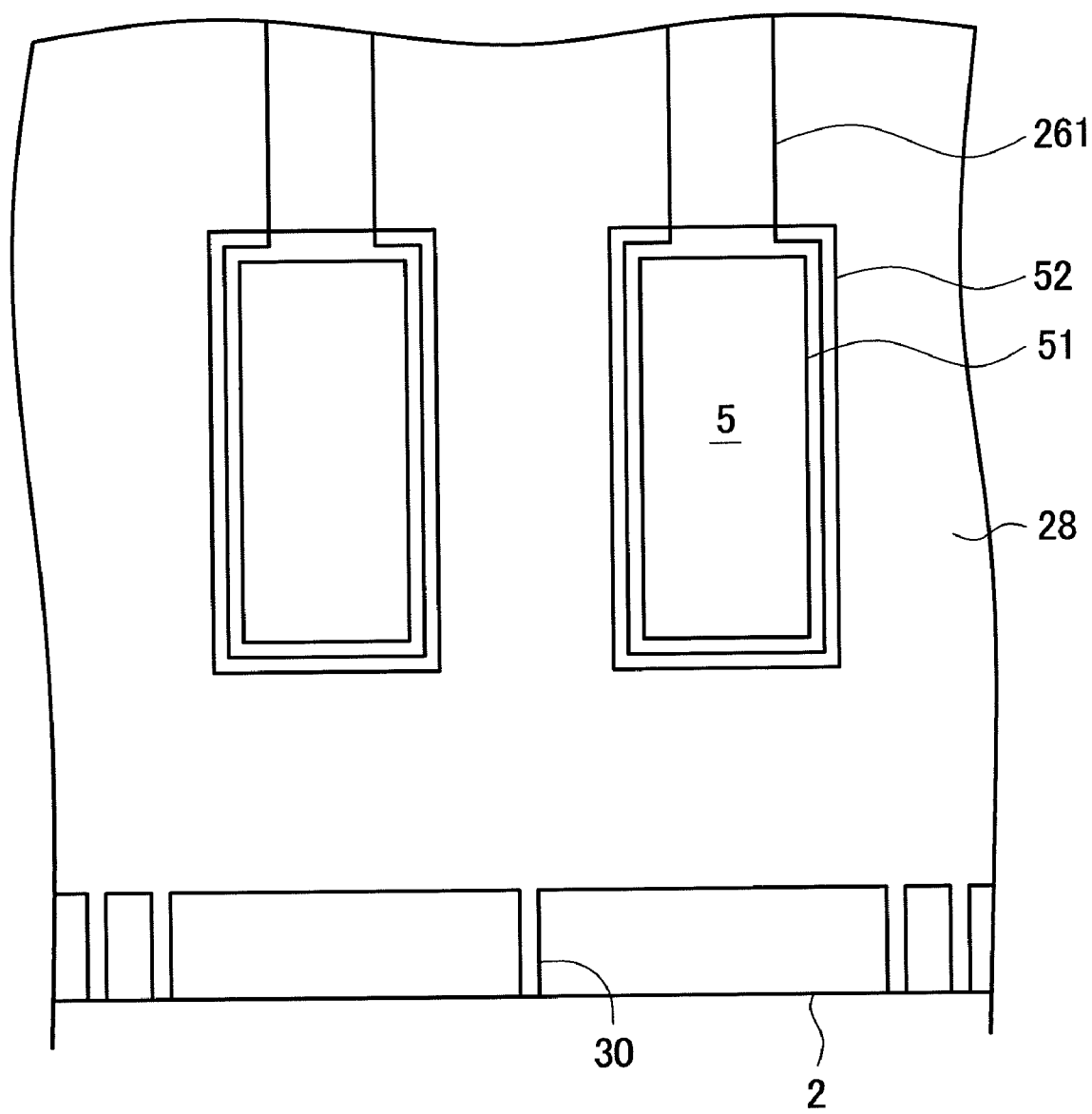
FIG. 16 is a diagram showing still another form of the second embodiment.

FIG. 16 shows an example forming one bridge section 30 of the organic passivation film 28 between the adjacent terminal sections ITO. If the number of bridge sections is small, the probability of the peeling of the bridge sections 30 also becomes low. In FIG. 16, the bridge section 30 is disposed at the center of the adjacent terminal sections ITO. Therefore, if the alignment between the wiring of the flexible wiring board 61 and the terminal sections 5 of the TFT substrate 2 is not shifted beyond a half of the distance DI between the terminal sections ITO, the object of the present invention can be achieved.

Regarding the minimum width of the bridge section 30 in FIG. 16, similarly to the first embodiment and so on, it is set to be equal to or larger than 3 μm taking the etching accuracy of the organic passivation film 28 and the adhesive strength between the organic passivation film 28 and the priming films into consideration. On the other hand, although the maximum width can be expanded to the distance DI between the terminal sections ITO in view of the shape thereof, it is possible to set the maximum width to about a half of the distance DI between the terminal sections ITO taking the peeling of the organic passivation film 28 when cutting the TFT substrate 2 into consideration.

Third Embodiment

Figure 17:
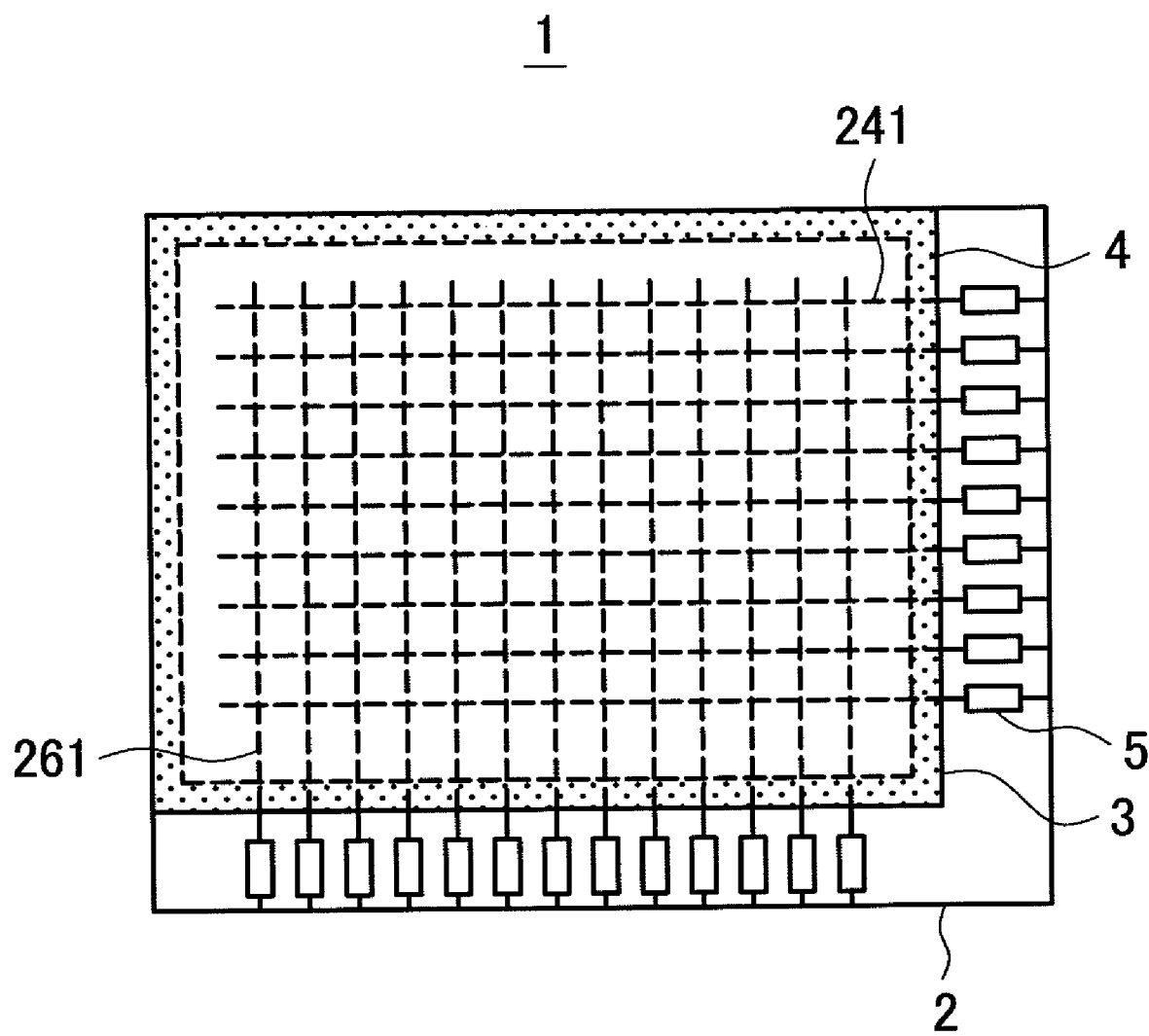
FIG. 17 is a schematic plan view of a liquid crystal display device to which a third embodiment is applied.
Figure 18:
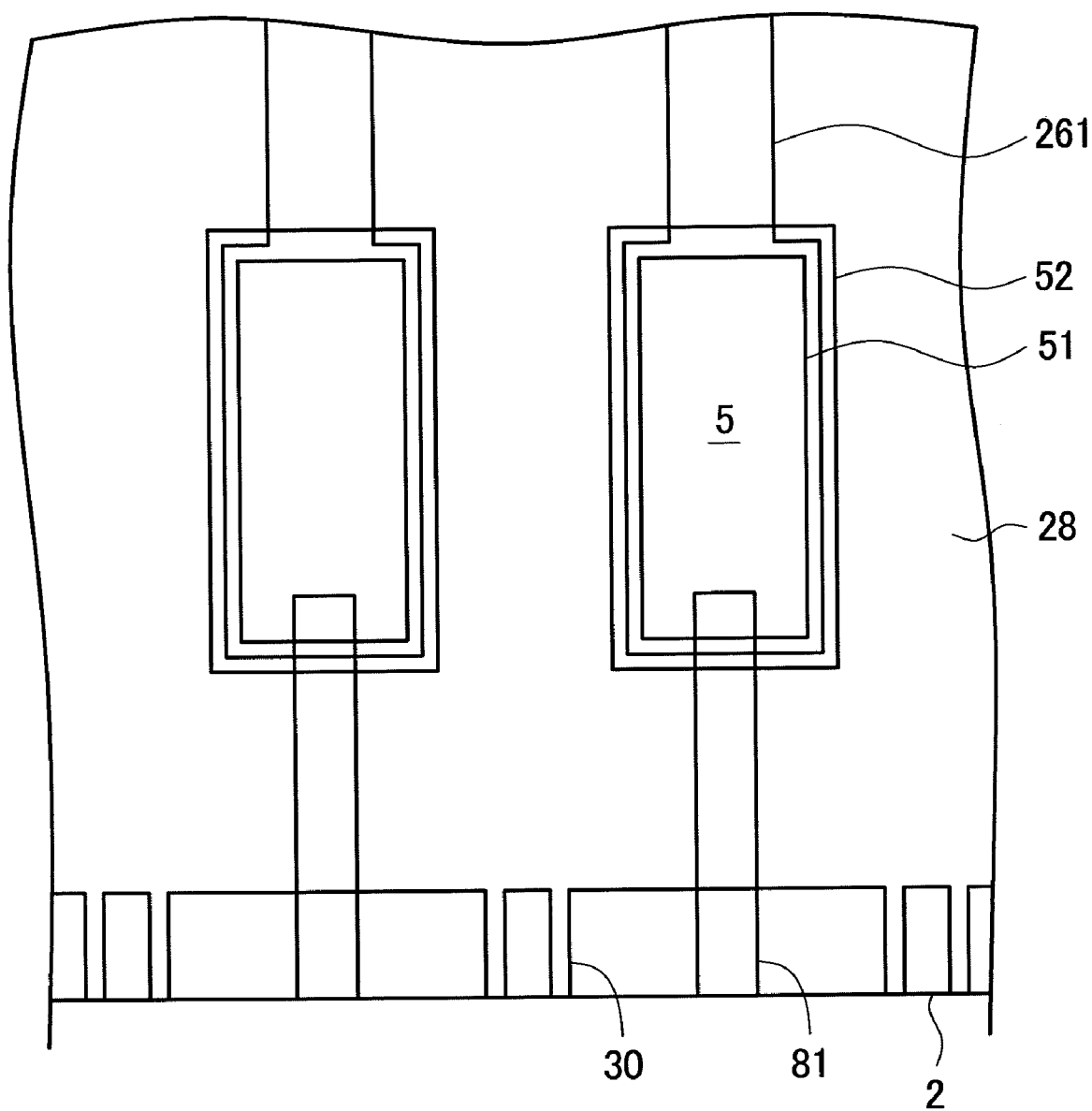
FIG. 18 is a plan view of a third embodiment.
Figure 19:
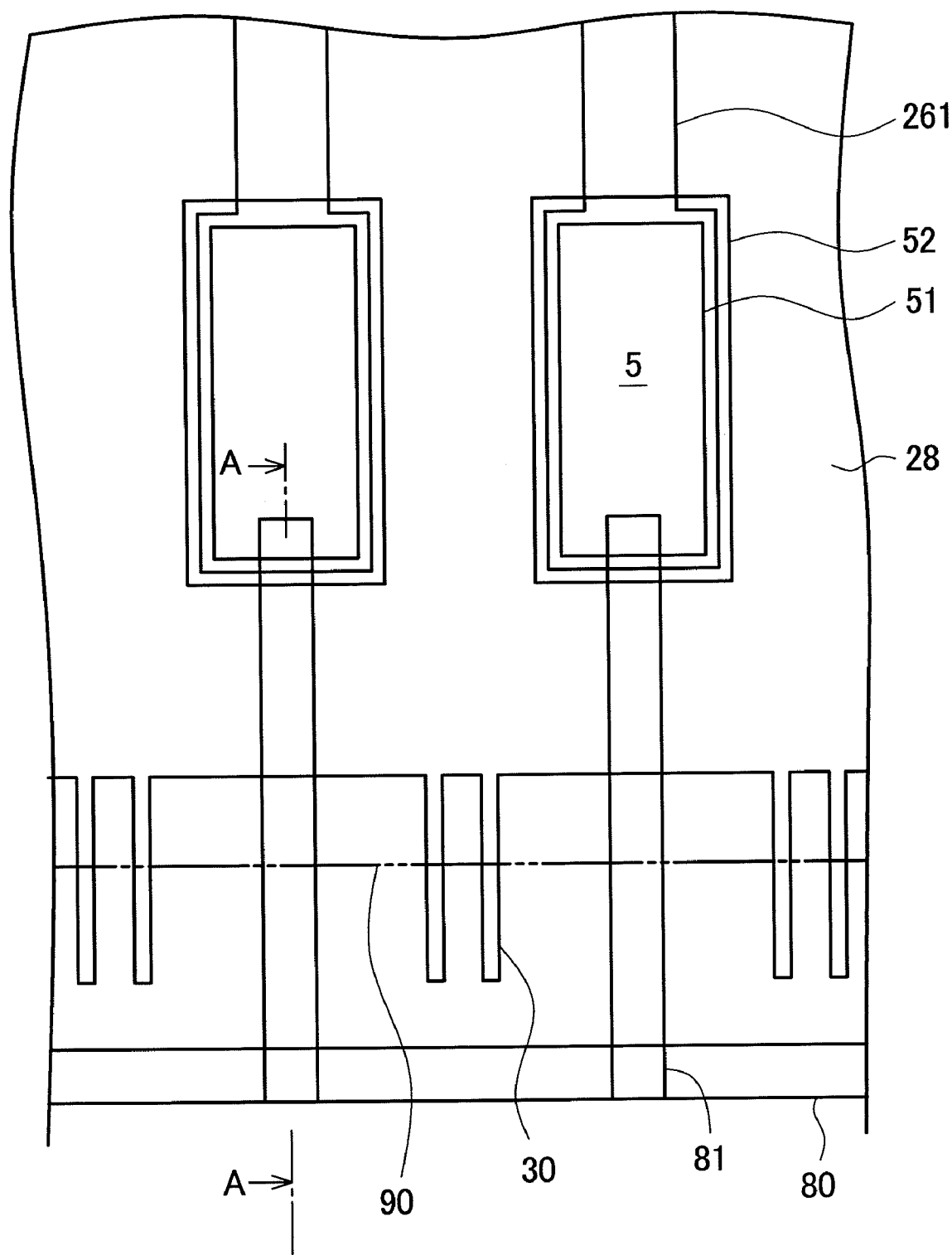
FIG. 19 is a plan view of the device in an intermediate process in the third embodiment.
Figure 20:
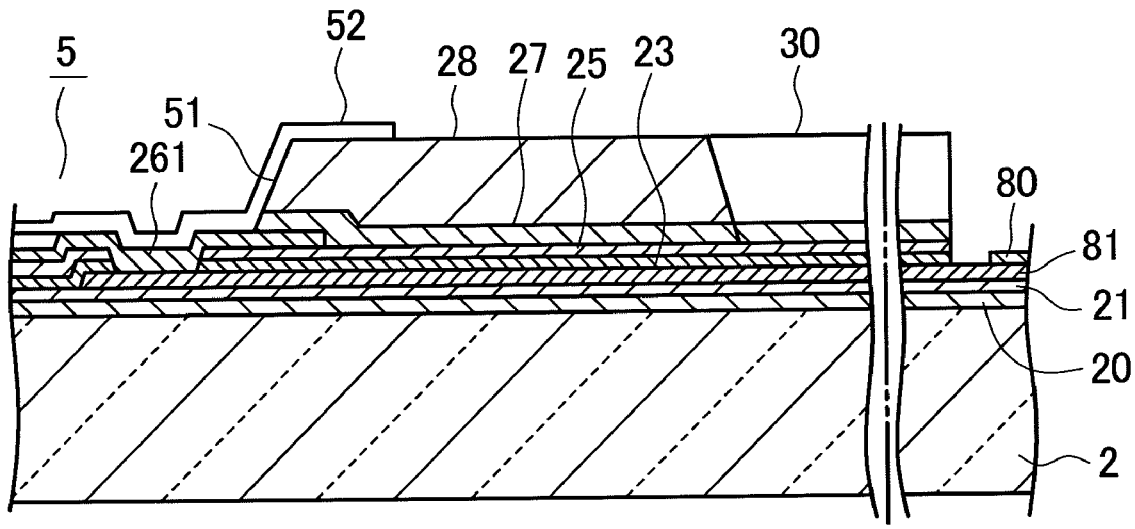
FIG. 20 is a cross-sectional view of the device in the intermediate process in the third embodiment.

FIGS. 17 through 20 show the third embodiment of the present invention. The manufacturing process of the liquid crystal display device 1 includes a rubbing process. The rubbing process is a process of rubbing the surface of the orientation film with a fibrous matter. In this case, static is generated and might break the TFT and so on. In order for preventing the breakage caused by the static, in the manufacturing process of the liquid crystal display device 1, the substrate in the condition before cutting into individual TFT substrates 2 is provided with a short ring 80 for shorting the static as shown in FIGS. 19 and 20. As shown in FIG. 17, the terminal sections 5 of the TFT substrate 2 are each provided with a short ring connection wire 81 for connecting to the short ring 80. The present invention can be applied to the case in which the short ring 80 is provided without any problems.

FIG. 18 is an enlarged view of the terminal sections 5 in the case in which the terminal sections 5 are each provided with the short ring connection wire 81. In FIG. 18, the short ring connection wires 81 extend from the terminal sections 5 to the end of the TFT substrate 2. FIG. 19 is a plan view showing the situation of the TFT substrate 2 before being cut into pieces. The chain double-dashed line shows the portion to be cut in the final process.

In the substrate before cutting shown in FIG. 19, the bridge sections 30 of the organic passivation film 28 are formed beyond the cutting line 90. The short ring connection wires 81 extend beyond the cutting line 90 to the short ring 80. The short ring 80 is formed of Al as is the case with the drain wires. The short ring 80 electrically connects the terminals to each other to prevent the voltage from being generated between the terminals. The short ring connection wires 81 for connecting the respective terminal sections 5 and the short ring 80 are formed of the semiconductor layer. Although the semiconductor layer has a higher resistivity, it is enough for the purpose of releasing the static charge. In FIG. 19, the substrate is finally cut at the section of the cutting line 90 illustrated with the chain double-dashed line, to form the final TFT substrates 2 shown in FIG. 18.

FIG. 20 is a cross-sectional view along the A-A line shown in FIG. 19. In FIG. 20, the short ring connection wire 81 extends beyond the cutting line 90, and is connected to the short ring 80. Since the short ring connection wire 81 is formed of the semiconductor layer, the first priming film 20 and the second priming film 21 are applied under the short ring connection wire 81. On the short ring connection wire 81, there is stacked the short ring 80 formed by the process of forming the drain wires.

As shown in FIG. 20, even if the short ring connection wire 81 is formed using the semiconductor layer, the bridge section 30 of the organic passivation film 28, which is a feature of the present invention, can be formed without any problems, and the action of the present invention is also the same. As is apparent from FIG. 20, the short ring connection wire 81 is formed under the gate insulating film 23, and accordingly, hardly influences the formation of the bridge section 30 of the organic passivation film 28 according to the present invention. In addition, since the semiconductor film forming the short ring connection wire 81 is as thin as about 100 nm, in this regard, the influence of the short ring connection wire 81 to the present invention is negligible.

Fourth Embodiment

Figure 21:
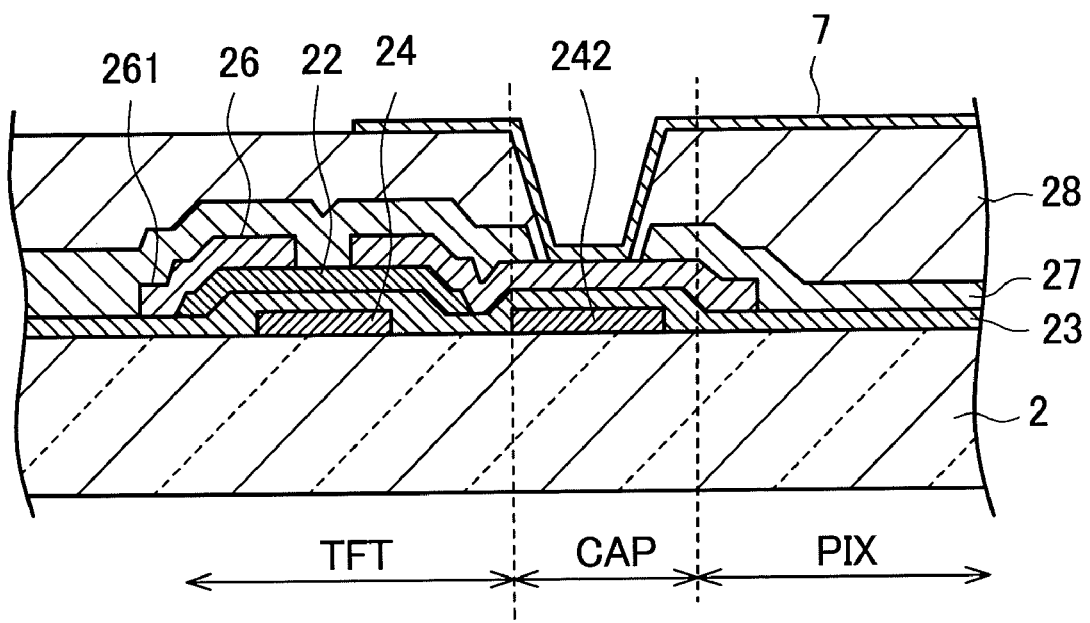
FIG. 21 is a cross-sectional view of a bottom-gate TFT.

FIG. 21 is a cross-sectional view of the TFT in the case in which the TFT formed in the pixel section is a so-called bottom gate type. Since the terminals are formed at the same time as the formation of the TFT in the pixel section, the terminal structure becomes different between the case with the top gate in the first embodiment and the case with the bottom gate in the present embodiment.

In FIG. 21, the gate electrode 24 is formed on the glass substrate. The gate insulating film 23 is formed covering the gate electrode 24. On the gate insulating film, there is deposited a semiconductor film 22 made of a-Si. On the both sides of the semiconductor layer, there are formed n+ layers of the semiconductor not shown in the drawings. The source electrode or the drain electrode (S/D electrode) 26 is formed of Al contiguous to the n+ layer of the semiconductor. The drain wires 261 are formed in the same layer as the source electrode or the drain electrode (S/D electrode) 26, the drain wires 261 extending to the respective terminal sections 5. The inorganic passivation film 27 is deposited covering the drain wires 261, and subsequently, the organic passivation film 28 is formed. Further, the pixel electrodes 7 are formed on the organic passivation film 28 as is the case with the top gate.

In the case of the bottom gate, the holding capacitance is formed between the holding capacitance wire 242 formed in the same layer as the gate electrode 24 and the source electrode or drain electrode (S/D electrode) 26 facing via the gate insulating film 23. As shown in FIG. 21, the pixel sections in the case of the bottom gate are also formed of the TFT sections, the holding capacitance sections CAP, and the pixel electrode sections PIX.

Figure 22:
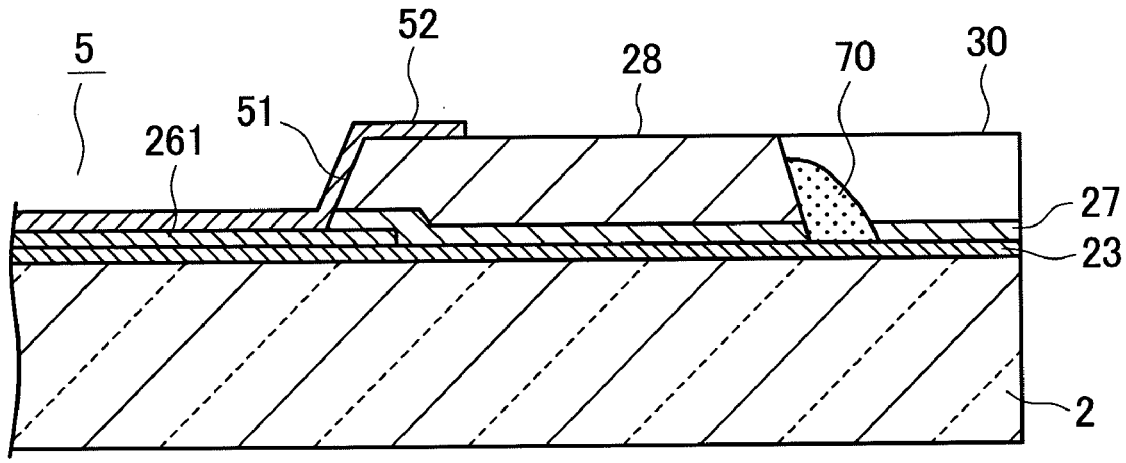
FIG. 22 is a cross-sectional view of a fourth embodiment.

FIG. 22 is a cross-sectional view of the structure of the terminal section corresponding to the case using the bottom gate TFT. FIG. 22 is a view corresponding to the A-A cross-section of FIG. 4 in the first embodiment. In FIG. 22, the gate insulating film 23 is formed on the glass substrate. On the gate insulating film, the drain wire 261 extends to the terminal section 5. The through hole 51 in the terminal section 5 is formed by developing or etching the inorganic passivation film 27 and the organic passivation film 28 covering the drain wire 261. The terminal section ITO 52 is formed covering the through hole 51 of the terminal section 5.

These elements, such as the gate insulating film 23, the drain wires 261, the inorganic passivation film 27, the organic passivation film 28, and the ITO 52 are deposited, etched, and so on by the same process used for forming the pixel sections. The layer structure of the terminal section 5 in the case with the bottom gate type becomes simpler in comparison with the layer structure in the case with the top gate type.

The problem with the terminal section 5 in the case with the bottom gate type is completely the same as the problem with the case with the top gate type. Specifically, as shown in FIG. 22, the problem that the conductive attachment 70 is attached to the edge section of the organic passivation film 28, which causes electrical connection between the terminals after connecting the flexible wiring board 61 is the same as that of the first embodiment 1 and so on. Also in the present embodiment, by forming the bridge sections 30 formed of the organic passivation film 28 to the end of the TFT substrate 2, the electrical connection between the terminal sections caused by the conductive attachment 70 can be cut as shown in FIG. 22. The reason therefor is the same as explained in the first embodiment and so on.

Fifth Embodiment

In the embodiments described hereinabove, the liquid crystal display device is explained as an example. The same problem as the problem arising in the liquid crystal display device will arise in an organic EL display device. In other words, the organic EL display device also requires the terminals for connecting to the external circuits, and in the manufacturing process thereof, deposition and etching and so on of a number of conductive materials are performed. Thus, the problem as described in the first embodiment arises in the terminal sections.

Figure 23:
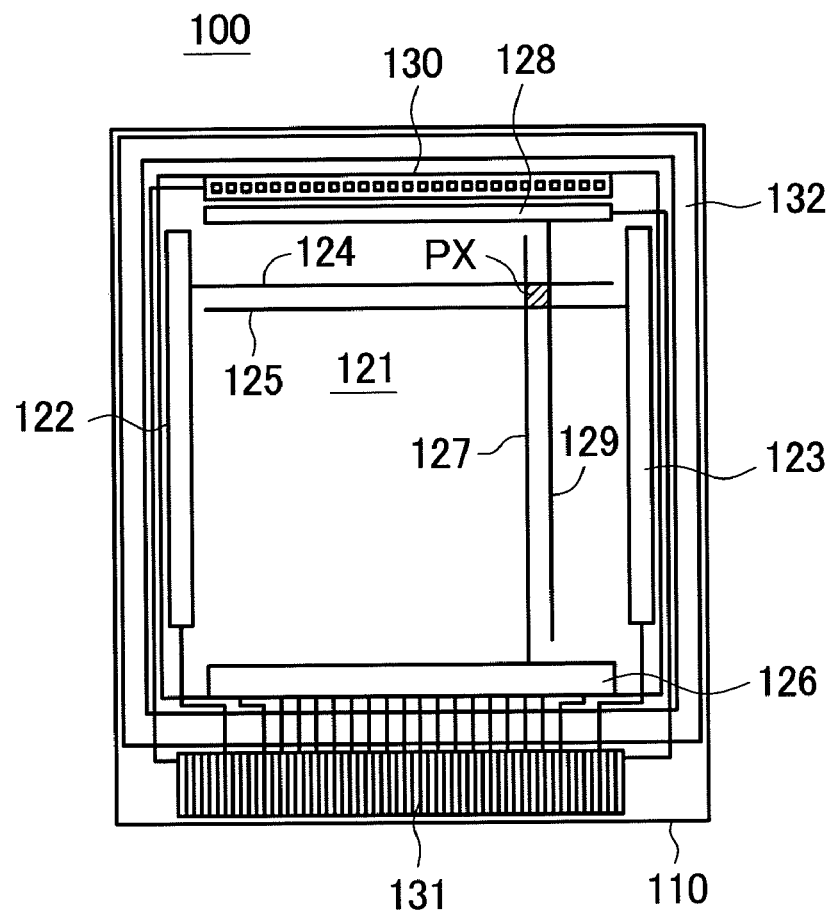
FIG. 23 is a schematic plan view of an organic EL display device.

FIG. 23 is an overall view of the organic EL display device 100. After a substrate 110 is completed, the organic EL display device is airtightly sealed with a rear glass not shown together with a desiccating agent not shown in order for protecting the organic EL layer from the moisture. FIG. 23 is a plan view of the substrate 110 viewed from the above before the rear glass is attached. A display area 121 is formed in a substantial part of the central region of the substrate 110. On the both sides of the display area, there are disposed scan signal drive circuits 122, 123. The gate signal lines extend from each of the scan signal drive circuits 122, 123. The gate signal lines 124 from the left-hand scan signal drive circuit 122 and the gate signal lines 125 from the right-hand scan signal drive circuit 123 are disposed alternately.

On the lower side of the display area 121, there is disposed an image signal drive circuit 126, and data signal lines 127 extend from the image signal drive circuit towards the side of the display area 121. On the upper side of the display area 121, there is disposed a current supply bus line 128, and current supply lines 129 extend from the current supply bus line 128 towards the side of the display area 121.

The data signal lines 127 and the current supply lines 129 are alternately disposed, and thus, an area of one pixel PX is formed in each of the areas surrounded by the data signal lines 127, the current supply lines 129, and the gate signal lines 124 and the gate signal lines 125.

On the upper side of the display area, there is formed a group of contact holes 130. The group of contact holes 130 has a role of electrically connecting the upper electrode of the organic EL layer formed in the entire display area to wires formed under an insulating film and extending to the terminals. On the lower side of the display area, there are formed terminals 131, and the scan signals, the data signals, the anode potential and the cathode potential to the organic EL layer, and so on are supplied from these terminals 131.

A sealing member 132 is formed so as to surround the display area 121, the scan signal drive circuits 122, 123, the image signal drive circuit 126, and the current supply bus line 128, and a part forming a frame for sealing the substrate 110 with the rear glass is adhered to the sealing member 132. On the substrate 110 outside the sealing member, there are formed the terminal sections 131, and a signal or a current is supplied from the terminal sections 131 to the scan signal drive circuits 122, 123, the image signal drive circuit 126, and the current supply bus line 128.

Figure 24:
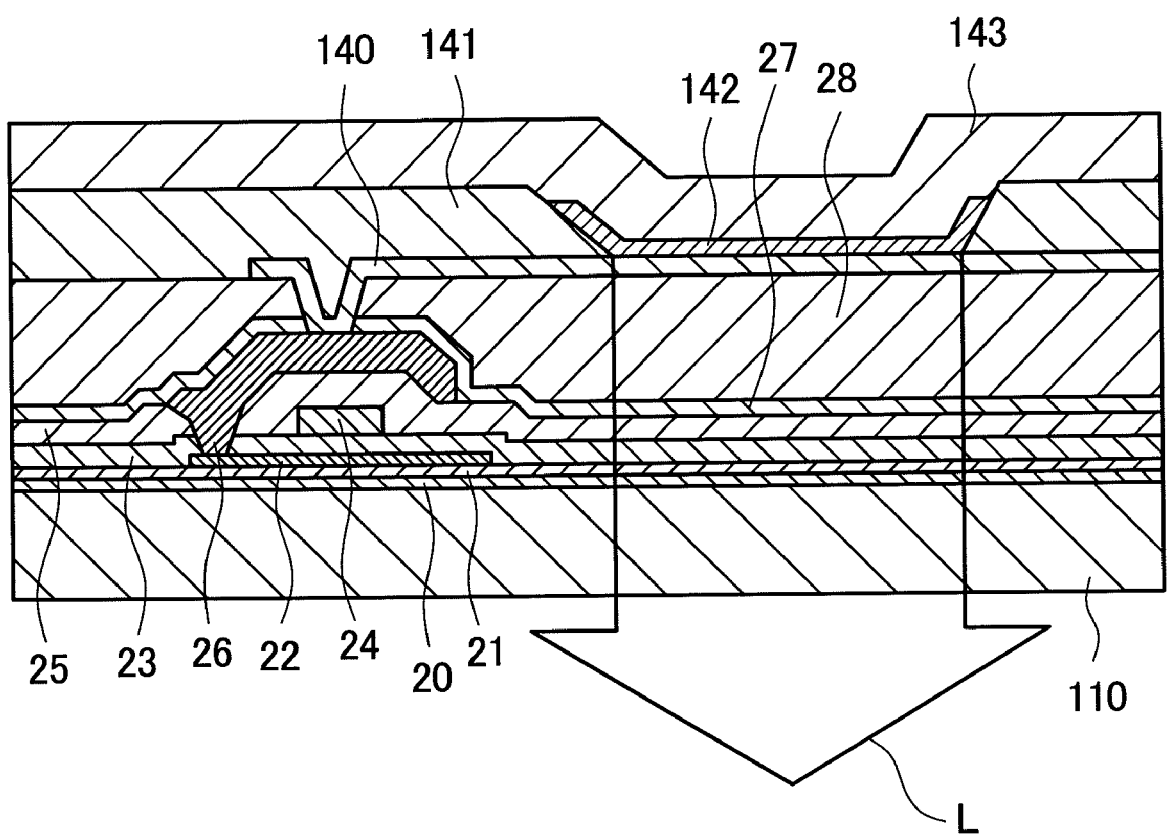
FIG. 24 is a cross-sectional view of a bottom emission type organic EL display device.

FIG. 24 is a cross-sectional view of the pixel section PX shown in FIG. 23. FIG. 24 is a view of the bottom emission type organic EL display device for emitting light towards the transparent substrate side. There is no difference between the organic EL display device and the liquid crystal display device in that the TFTs are used as the switching elements. Further, the structure of the TFT section is the same as the structure in the case of the top-gate type of the liquid crystal display device shown in FIG. 3. Specifically, on the glass substrate 110, there are formed sequentially the first priming film 20, the second priming film 21, the semiconductor layer 22, the gate insulating film 23, the gate electrode 24, the interlayer insulating film 25, the source or the drain electrode 26, the inorganic passivation film 27, and the organic passivation film 28. The formation, the function, and so on of each of the films are the same as explained with reference to FIG. 3.

Although in the liquid crystal display device the pixel electrodes are formed on the organic passivation film 28 using ITO, in the organic EL display device the lower electrodes 140 of the organic EL layer are formed. In this case, the lower electrodes 140 are anodes. It should be noted that since the lower electrodes are also formed of ITO, the processes on and before the ITO forming process are the same as those of the liquid crystal display device described with reference to FIG. 3. Further, the point of forming the ITO of the terminal sections at the same time as forming the ITO used as the lower electrodes (anodes) is the same as in the case with the liquid crystal display device.

After the lower electrodes 140 are formed in the organic EL display device, a bank 141 for separating each of the pixels is formed. As the material of the bank 141, acrylic resin, siloxane resin, polyimide and so on are used, and in many cases, the same material as the organic passivation film 28 is used. After providing the through holes by etching to the light emitting area to which the organic EL layer 142 is to be formed to the bank 141, the organic EL layer 142 is provided to the through hole section by evaporation. The organic EL layer 142 typically has a five-layered structure including an electron injection section, an electron transport section, a light emitting section, a hole transport section, and a hole injection section or the like, each of the layers has a thickness of about 10 nm through 50 nm. On the organic EL layer 142, there is formed an upper electrode 143 with Al. The light emitted from the organic EL layer 142 travels towards the glass substrate 110 (the bottom emission structure). The light traveling towards the upper electrode 143 is reflected by the upper electrode 143, and travels towards the glass substrate 110 (the bottom emission structure).

Figure 25:
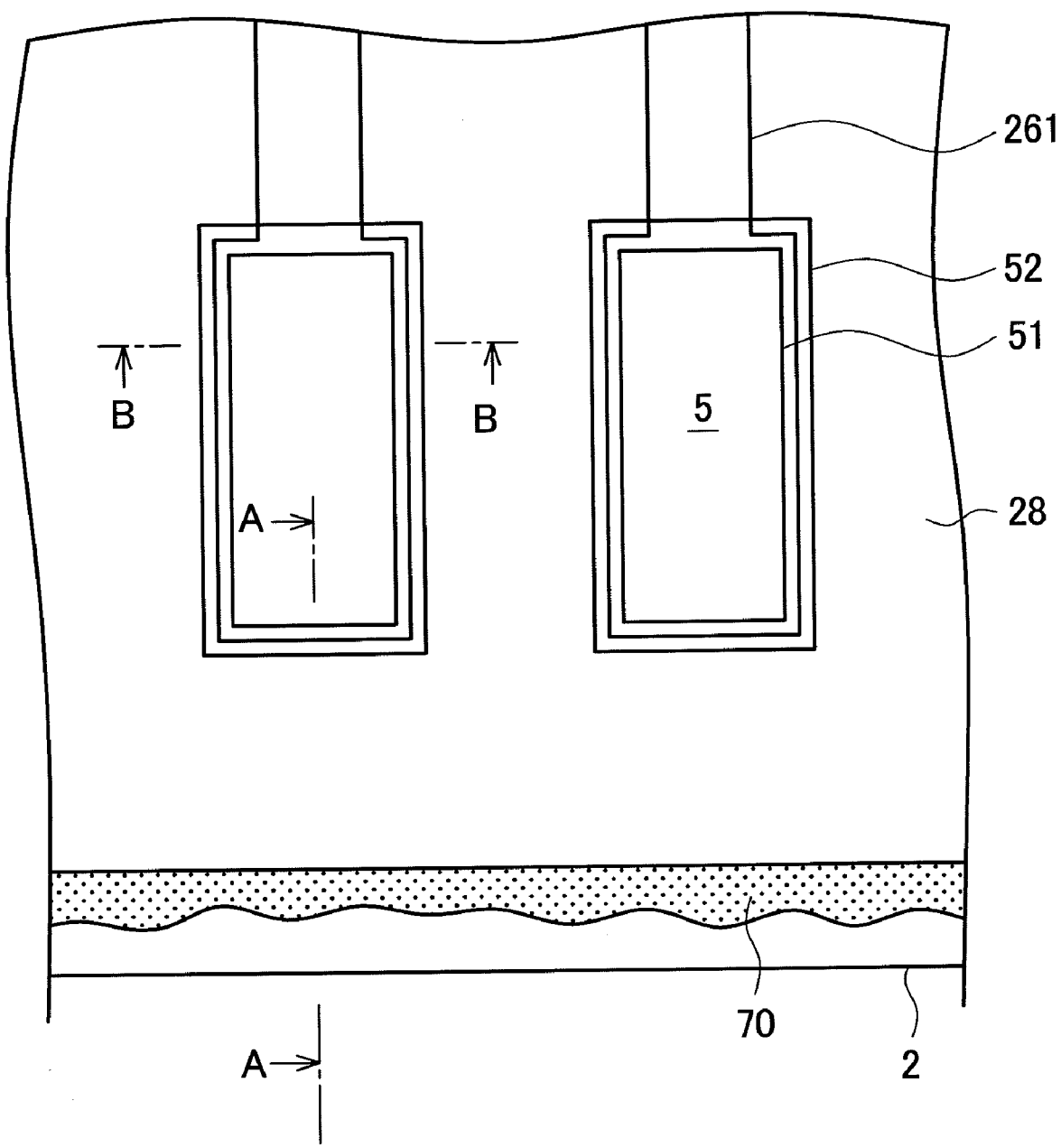
FIG. 25 is a plan view showing the problem to be solved by the present invention.
Figure 26:
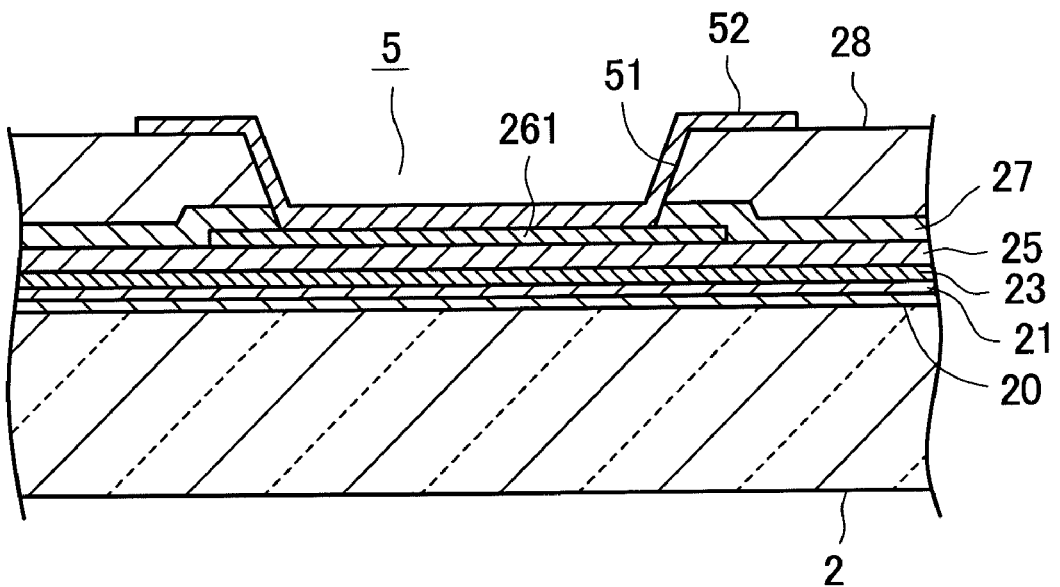
FIG. 26 is a cross-sectional view along the B-B line shown in FIG. 25.
Figure 27:
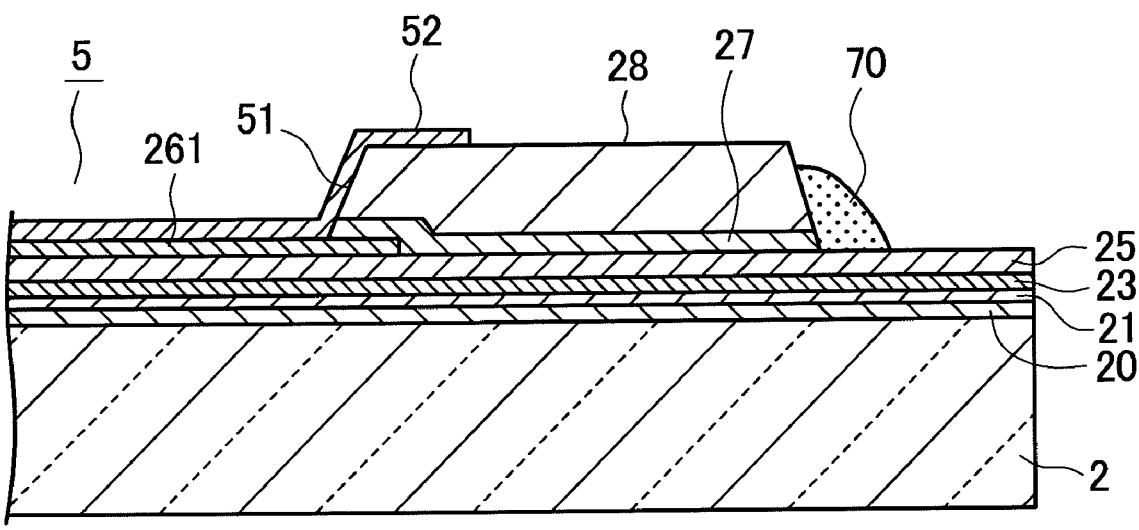
FIG. 27 is a cross-sectional view along the A-A line shown in FIG. 25.
Figure 28:
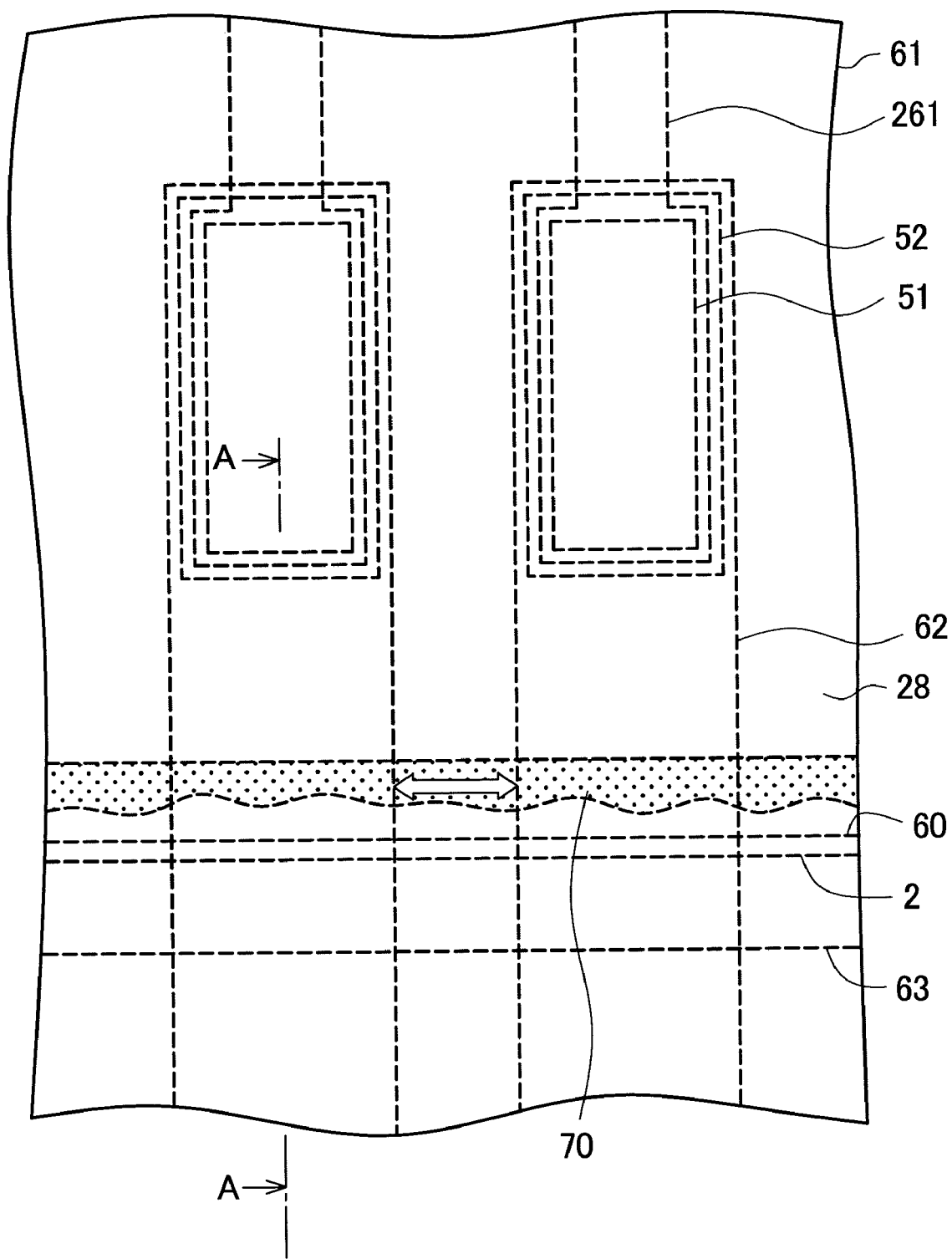
FIG. 28 is a perspective view showing the problem to be solved by the present invention.
Figure 29:
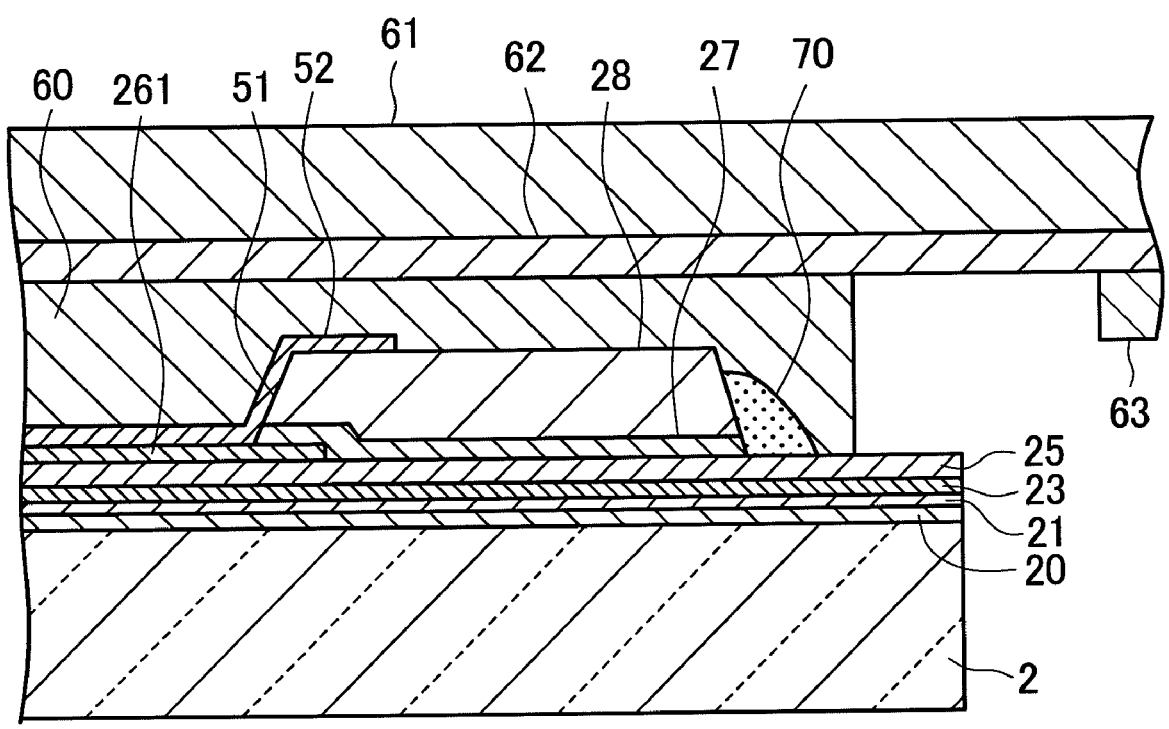
FIG. 29 is a cross-sectional view along the A-A line shown in FIG. 28.

As shown in FIG. 24, since the TFT section is the same as that of the liquid crystal display device, the structure of the terminal section is the same as that of the liquid crystal display device. Therefore, the structure of the terminal section of the organic EL display device explained hereinabove is the same as shown in FIGS. 25 and 26. Further, in the manufacturing process of the organic EL display device, a number of coating processes and etching processes of the conductive materials are included. Accordingly, the conductive attachment is easily attached to the edge of the organic passivation film 28 in the vicinity of the terminal sections. In other words, the problem explained with reference to FIGS. 27 through 29 arises. Therefore, the measures explained in the first embodiment of the present invention and so on can be applied without modifications.

Although the case with the bottom emission type organic EL display device is hereinabove explained, the present invention can be applied to the case with the top emission type organic EL display device as well. The top emission type organic EL display device is only different in the layer structure of the organic EL layer 142 and the electrode structure for holding the organic EL layer 142, and is the same in the TFT sections as the bottom emission type organic EL display device. In the top emission type organic EL display device, metal with a high reflectivity such as Al or an Al alloy is used as the lower electrode 140 as the cathode, and the ITO is used as the upper electrode 143, namely the anode. In this case, the emitted light from the organic EL layer 142 is emitted from the side of the ITO, the upper electrode 143. In this case, when the ITO as the upper electrode 143 is formed, the ITO provided to the terminal sections is formed in the same process.

What is claimed is:

1. A display device comprising:
   a substrate having an image forming section in which a plurality of pixel sections is arranged in a matrix, each of the pixel sections including a thin film transistor and a pixel electrode;
   a plurality of terminal sections formed in a periphery of the substrate and for supplying the pixel electrode with a signal;
   an organic insulating film having a through hole formed in the terminal section; and
   a metal oxide conductive film formed so as to cover the through hole and a periphery of the through hole,
   wherein an end of the organic insulating film is located on the substrate outer than the terminal sections, and inner than an end of the substrate,
   a part of the organic insulating film forms a bridge section extending outside the end of the organic insulating film to the end of the substrate, and
   the bridge section is located between the terminal sections adjacent to each other.

2. The display device according to claim 1,
   wherein an width of the bridge section is larger than a thickness of the organic insulating film and smaller than a half of a distance between the terminal sections adjacent to each other.

3. The display device according to claim 1,
   wherein a plurality of the bridge sections is located between the terminal sections adjacent to each other.

4. The display device according to claim 1,
   wherein the bridge section has a portion with a larger width and a portion with a smaller width.

5. The display device according to claim 4,
   wherein the larger width is smaller than a half of a distance between the terminal sections adjacent to each other, and the smaller width is larger than a thickness of the organic insulating film.

6. The display device according to claim 1,
   wherein the bridge section and the through hole provided to the terminal section of the organic insulating film are formed in the same process.

7. The display device according to claim 1,
   wherein the metal oxide conductive film is made of ITO.

8. A liquid crystal display device comprising:
   a substrate having an image forming section in which a plurality of pixel sections is arranged in a matrix, each of the pixel sections including a thin film transistor and a pixel electrode; and
   an organic insulating film formed in an upper layer of the thin film transistor,
   wherein the pixel electrode is formed on the organic insulating film,
   a wire formed in the same process as a drain wire connected to the thin film transistor extends to a terminal section,
   the organic insulating film is formed to the outside of the image forming section,
   a through hole is provided to the organic insulating film in the terminal section,
   a metal oxide conductive film covers the through hole and a periphery of the through hole,
   the wire formed in the same process as the drain wire and the metal oxide conductive film are connected to each other at the through hole,
   an end of the organic insulating film is located on the substrate outer than the terminal sections, and inner than an end of the substrate,
   a part of the organic insulating film forms a bridge section extending outside the end of the organic insulating film to the end of the substrate, and
   the bridge section is located between the terminal sections adjacent to each other.

9. The liquid crystal display device according to claim 8,
   wherein the pixel electrode and the metal oxide conductive film provided to the terminal sections are made of the same material, and are formed in the same process.

10. The liquid crystal display device according to claim 8,
    wherein the metal oxide conductive film is made of ITO.

11. The liquid crystal display device according to claim 8,
    wherein the wire extending to the terminal section and formed in the same process as the drain wire is the drain wire.

12. A liquid crystal display device comprising:
    a substrate having an image forming section in which a plurality of pixel sections is arranged in a matrix, each of the pixel sections including a thin film transistor and a pixel electrode; and
    an organic insulating film formed in an upper layer of the thin film transistor,
    wherein the pixel electrode is formed on the organic insulating film,
    a wire formed in the same process as a gate wire connected to the thin film transistor extends to a terminal section,
    the organic insulating film is formed to the outside of the image forming section,
    a through hole is provided to the organic insulating film in the terminal section,
    a metal oxide conductive film covers the through hole and a periphery of the through hole,
    the wire formed in the same process as the gate wire and the metal oxide conductive film are connected to each other at the through hole,
    an end of the organic insulating film is located on the substrate outer than the terminal sections, and inner than an end of the substrate,
    a part of the organic insulating film forms a bridge section extending outside the end of the organic insulating film to the end of the substrate, and
    the bridge section is located between the terminal sections adjacent to each other.

13. The liquid crystal display device according to claim 12,
    wherein the wire formed in the same process as the gate wire is the gate wire.

14. An organic EL display device comprising:
    a substrate having an image forming section in which a plurality of pixel sections is arranged in a matrix, each of the pixel sections including a thin film transistor and an organic EL light emitting section; and
    an organic insulating film formed in an upper layer of the thin film transistor,
    wherein the organic EL light emitting section includes a lower electrode formed of an oxide conductive film, an organic EL layer and an upper electrode formed of a metal layer, and is formed on the organic insulating film,
    a plurality of terminal sections is formed in a periphery of the image forming section,
    the organic insulating film is formed to the outside of the image forming section,
    a through hole is provided to the organic insulating film in the terminal section, a metal oxide conductive film covers the through hole and a periphery of the through hole, an end of the organic insulating film is located on the substrate outer than the terminal sections, and inner than an end of the substrate, a part of the organic insulating film forms a bridge section extending outside the end of the organic insulating film to the end of the substrate, and the bridge section is located between the terminal sections adjacent to each other.

15. An organic EL display device comprising:

a substrate having an image forming section in which a plurality of pixel sections is arranged in a matrix, each of the pixel sections including a thin film transistor and an organic EL light emitting section; and an organic insulating film formed in an upper layer of the thin film transistor, wherein the organic EL light emitting section includes a lower electrode formed of a metal layer, an organic EL layer and an upper electrode formed of an oxide conductive film, and is formed on the organic insulating film, a plurality of terminal sections is formed in a periphery of the image forming section, the organic insulating film is formed to the outside of the image forming section, a through hole is provided to the organic insulating film in the terminal section, a metal oxide conductive film covers the through hole and a periphery of the through hole, an end of the organic insulating film is located on the substrate outer than the terminal sections, and inner than an end of the substrate, a part of the organic insulating film forms a bridge section extending outside the end of the organic insulating film to the end of the substrate, and the bridge section is located between the terminal sections adjacent to each other.

* * * * *